(12) United States Patent
Ooishi et al.

(10) Patent No.: US 6,448,826 B1
(45) Date of Patent: Sep. 10, 2002

(54) SEMICONDUCTOR DEVICE INCORPORATING CIRCUIT FOR GENERATING CONTROL CLOCK IN ACCORDANCE WITH EXTERNAL CLOCK FREQUENCY

(75) Inventors: Tsukasa Ooishi, Hyogo (JP); Toshiaki Kawasaki, Osaka (JP)

(73) Assignees: Mitsubishi Denki Kabushiki Kaisha, Tokyo (JP); Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/790,501

(22) Filed: Feb. 23, 2001

(30) Foreign Application Priority Data

Aug. 28, 2000 (JP) ....................... 2000-257011

(51) Int. Cl.[7] ................................ H03L 7/06
(52) U.S. Cl. .................. 327/158; 327/153; 327/161
(58) Field of Search ................ 327/141, 147, 327/149, 151, 152, 153, 154, 156, 158, 160, 161, 165, 172, 261, 269, 270, 271, 276, 291, 293, 295

(56) References Cited

U.S. PATENT DOCUMENTS 5,087,829 A * 2/1992 Ishibashi et al. ............ 327/152
5,699,003 A * 12/1997 Saeki ....................... 327/261
5,740,123 A * 4/1998 Uchida ..................... 365/233
5,999,027 A * 12/1999 Yamazaki .................. 327/161
6,059,508 A * 5/2000 Takai ....................... 327/161
6,075,395 A * 6/2000 Saeki ....................... 327/161
6,084,453 A * 7/2000 Fuse et al. ................. 327/176

FOREIGN PATENT DOCUMENTS

JP   05-233093   10/1993
JP   10-069769   10/1998

* cited by examiner

Primary Examiner—Timothy P. Callahan
Assistant Examiner—Hai L. Nguyen
(74) Attorney, Agent, or Firm—McDermott, Will & Emery

(57) ABSTRACT

A semiconductor device according to the present invention operates in response to a control clock generated by a control clock generating circuit. The control clock generating circuit includes a DLL circuit detecting an external clock period by a synchronous operation, a reference clock pulse generating circuit activated in synchronization with an external clock to generate a reference dock pulse having a pulse width in accordance with the external clock period, a delay circuit delaying stepwise the reference clock pulse per unit delay time in accordance with the external clock period, and an internal control clock generating circuit setting activation and inactivation timing of the control clock based on the delayed clock pulse.

20 Claims, 20 Drawing Sheets

$$Th = \frac{N}{M} \cdot Tc$$

| PHASE<br>ADVANCED<br>↑<br>↓<br>PHASE<br>DELAYED | CASE | 1 | 2 | 3 | 4 | 5 | |
|---|---|---|---|---|---|---|---|
| | RCLKa | L | L | L | L | H | ⎫ |
| | RCLKb | L | L | L | H | H | ⎬ L: RCLK IS MORE ADVANCED |
| | RCLKc | L | L | H | H | H | ⎨ H: RCLK IS MORE DELAYED |
| | RCLKd | L | H | H | H | H | ⎭ |
| | TPNa | L | L | L | L | H | |
| | TPNb | L | L | L | H | L | |
| | TPNc | L | L | H | L | L | |
| | TPNd | H | H | L | L | L | |

DIFFERENT CLOCK CYCLES BECOME CONTINUOUS

SEMICONDUCTOR DEVICE INCORPORATING CIRCUIT FOR GENERATING CONTROL CLOCK IN ACCORDANCE WITH EXTERNAL CLOCK FREQUENCY

BACKGROUND OF THE INVENTION

1. Field of the Invention

The present invention relates to a semiconductor device, and more particularly to a semiconductor device operating synchronously with an external clock input from an external source.

2. Description of the Background Art

In order to deal with demands of higher operating speed and larger data capacity for semiconductor devices, a technology has been employed, in which a plurality of semiconductor devices mounted on one system are collaboratively operated in synchronization with each other for efficient entire operation.

In such a system, each semiconductor device is required to perform an instructed internal operation synchronously with a clock signal common to the entire system (hereinafter also referred to as an external clock signal).

Therefore, a semiconductor device in which synchronous operation is required generally includes a control clock generating circuit for generating an internal control clock (hereinafter also simply referred to as a control clock) for controlling operations of internal circuits at a timing synchronous with the external clock.

FIG. 27 is a block diagram showing a configuration of a conventional control clock generating circuit 300. Control clock generating circuit 300 generates control clocks ISG1 and ISG2 synchronously with an external clock CLK.

Referring to FIG. 27, control clock generating circuit 300 includes a flip-flop 310 taking in a command signal CMD to generate a command clock CLKM in response to an activation timing of external clock CLK, and a pulse generating circuit 320 generating a reference clock pulse CLKP activated for a certain period in response to an activation of command clock CLKM.

Command signal CMD is activated when a command is provided to a semiconductor device including control clock generating circuit 300. Thus, command clock CLKM output from flip-flop 310 is updated in its signal level for each activation timing of external clock CLK, and is activated to a high level in a clock cycle in which a command is provided. As to signal levels of a clock and a control signal, high level and low level are hereinafter indicated as H level and L level respectively.

FIG. 28 is a circuit diagram showing a configuration of a pulse generating circuit 320.

Referring to FIG. 28, pulse generating circuit 320 includes a delay stage 322 for delaying command clock CLKM, and a logic gate 324 outputting a result of AND logical operation between an output of delay stage 322 and command clock CLKM as reference clock pulse CLKP.

Delay stage 322 includes an odd number of inverters. Delay stage 322 delays command clock CLKM by a delay time Th corresponding to the number of the inverters. This makes reference clock pulse CLKP a one shot pulse which is activated (to H level) for Th period in response to a transition of command clock CLKM from L level to H level. The activation period of a clock represented by the reference clock pulse is hereinafter also simply referred to as a pulse width.

Referring again to FIG. 27, reference clock pulse CLKP is fed to a delay circuit 330. Delay circuit 330 includes a plurality of delay units 340 connected in series. Each delay unit 340 is constituted by, for example, identical inverters in a predetermined even number. An output of each delay unit is provided with a tap. Hereinafter, a reference character TP is used for generic indication of each tap, and a particular tap is denoted with subscripts, such as TPa, TPb and so forth.

Such a configuration allows reference clock pulse CLKP delayed stepwise by delay time tdf to be taken out by selecting tap TP. An output from each tap is amplified by a signal buffer 345.

An internal control clock generating circuit 350 generates a control clock based on a signal taken in from each tap TP in delay circuit 330. As an example of the control clock, ISG1 and ISG2 are representatively shown in FIG. 27.

Internal control clock generating circuit 350 includes a logic gate 352 outputting an OR operation result of output signals of taps TPb and TPe. Logic gate 352 outputs control clock ISG1.

Internal control clock generating circuit 350 further includes a logic gate 354 outputting an OR operation result of output signals of taps TPa and TPd, a logic gate 356 outputting an OR logic operation result of output signals of taps TPc and TPf, and a logic gate 358 outputting an OR logical operation result of output signals of logic gates 354 and 356. Logic gate 358 outputs control clock ISG2.

Thus, a control clock activated in response to an activation of the reference clock pulse can be generated by OR operation between a plurality of tap outputs whose activation periods overlapped with each other. If a number of tap outputs are used in generating the control clock having a relatively long pulse width such as control clock ISG2 can be generated.

However, in a conventional control clock generating circuit 300, the pulse width of reference clock pulse CLKP corresponds to a certain time period determined by the number of inverters constituting delay stage 322. Further, a unit time tdf applied stepwise at delay circuit 330 also corresponds to a certain time period dependent on the number of inverters constituting delay unit 340.

Therefore, when a semiconductor device on which control clock generating circuit 300 is mounted is applied to various systems, it may be difficult to generate a control clock corresponding to a change of an operating frequency, i.e., a period of external clock CLK.

FIGS. 29 and 30 are timing charts illustrating a problem of a conventional control clock generating circuit 300 corresponding to variation of the operating frequency, i.e., the period of external clock CLK.

FIG. 29 shows an example where the operating frequency is relatively low, that is, the period of external clock CLK is relatively long.

Referring to FIG. 29, the period of external clock CLK is T0. In a clock cycle in which a command is provided, reference clock pulse CLKP is activated for a certain time period Th in response to the activation of external clock CLK at time t1. Reference clock pulse CLKP is delayed stepwise per unit delay time tdf in delay circuit 330, and is output from each tap TP.

Control signal ISG1 is generated by logic gate 352 in response to a signal output from TPb and TPe of a plurality of taps TP provided at delay circuit 330. An output of tap TPb rises to H level at time t2, and falls to L level at time t4. A difference of propagation delays between a leading edge and a trailing edge of a transistor in the delay unit may, as shown, make the interval between time t2 and time t4 longer than pulse width Th of reference clock pulse CLKP.

At t3 preceding time t4, an output of tap TPe rises to H level. An output signal of tap Tb starts to fall after a certain time period Th from time t3, and changes to L level at time t4. As a result, control clock ISG1 can be a control signal activated for a period from time t2 to time t5 in one clock cycle.

FIG. 30 shows an example where an operating frequency is relatively high, that is, a period of external clock CLK is relatively short.

Referring to FIG. 30, a period T0' of external clock CLK is shorter than period T0 of external clock CLK shown in. FIG. 29. As in the case with FIG. 29, reference clock pulse CLKP is activated to H level for a certain period Th in response to an activation of external dock CLK at time t1 in a clock cycle to which a command is applied.

Reference clock pulse CLKP is fed to delay circuit 330 as in the case with FIG. 29, and can output reference clock pulse CLKP delayed stepwise per unit delay time tdf at each tap of delay circuit 330.

However, for pulse width Th of reference clock pulse CLKP and unit delay time tdf set at delay circuit 330, the operating frequency, i.e., the period of external clock CLK is independent of variations, having the same value as the one in FIG. 29. Thus, the fact that pulse width Th of reference clock pulse CLKP and unit delay time tdf at delay circuit 330 are constant independent of the period of external clock CLK results in a problem described below.

As in the case with FIG. 29, an output of tap TPb is changed to H level at time t2, and starts to fall after a predetermined time period Th. As a result, at time t4, the output of tap TPb is changed to L level. Also in the subsequent clock cycle, if a command is applied, tap TPb is again changed to H level after period T0' of the external clock has passed since time t1.

The output of tap TPe is changed to H level at time t3, and starts to fall after Th has passed since time t3. It is then changed to L level at time t5.

Thus, because pulse width Th of reference clock pulse CLKP is constant while external clock period T0' is shortened, a problem arises in which the output of tap TPb is changed to H level corresponding to a subsequent clock cycle before time t5 at which the output of tap TPe is completely changed to L level.

This makes control clock ISG1 continuous between two successive clock cycles. Thus, at the second clock cycle, an operation of internal circuits in response to the leading edge of control clock ISG1 cannot be performed as prescribed.

Further, because unit delay time tdf is a constant independent of the frequency of external clock CLK, the number of taps available for adjusting generation timing of a control clock in a clock cycle will be less when operated with high frequency, that is, when the period of external clock CLK is short. This lowers a degree of freedom for timing setting of activation and inactivation of a control clock for instructing operational timing for the internal circuits.

SUMMARY OF THE INVENTION

It is an object of the present invention to provide a semiconductor device operating synchronously with an external clock, including a control clock generating circuit generating a control clock determining an operational timing of an internal circuit at an appropriate timing corresponding to an external clock frequency.

According to one aspect of the present invention, a semiconductor device operating synchronously with an input clock repeating a transition between a first state and a second state in a certain period includes a control clock generating circuit and an internal circuit.

The control clock generating circuit generates a control clock synchronously with the input clock. The control clock generating circuit is activated in response to the transition of the first state of the input clock, and includes a first pulse generating circuit generating a reference clock pulse for which an activation state is maintained for a predetermined period set in accordance with the certain period, a first delay circuit delaying stepwise the reference clock pulse from the first pulse generating circuit to output a plurality of delayed clock pulses, and a second pulse generating circuit generating the control clock based on at least two of the plurality of delayed clock pulses. The internal circuit performs a predetermined operation in response to the control clock.

According to another aspect of the present invention, a semiconductor device operating synchronously with an input clock repeating first and second state transitions between a first state and a second state by a certain period includes an internal circuit and a control clock generating circuit. The internal circuit performs a predetermined operation in response to a first command and a second command provided from the first command after predetermined clock cycles of said input clock. The control clock generating circuit takes in the first and second commands to generate a control clock for rendering the internal circuit perform the predetermined operation in response to the first state transition of the input clock. The control clock generating circuit includes a period detecting circuit detecting the certain period during L clock cycles (L is a natural number), that is at least shorter than said predetermined cycles, after the first command is received, a first pulse generating circuit activated in response to the first state transition of the input clock to generate a reference clock pulse for which an activation state is maintained for a predetermined period set in accordance with the certain period detected by the period detecting circuit, a first delay circuit having a plurality of first delay units connected in series and each having unit delay time set in accordance with the certain time period and delaying stepwise the reference clock pulse from the first pulse generating circuit to output a plurality of delayed clock pulses, and a second pulse generating circuit generating the control clock based on at least two of the plurality of delayed clock pulses.

Therefore, a main advantage of the present invention is to generate a control clock controlling operational timing of an internal circuit based on delayed clock pulses obtained by stepwisely delaying a reference clock pulse activated in response to an input clock and having an activation period in accordance with a period of the input clock. Therefore, it is advantageous that the control clock can be generated inside of the semiconductor device at an appropriate timing corresponding to the frequency of the input clock.

Further, the period of the input clock is detected during a period from generation of the first command to generation of the second command, so that the control clock can be generated at an appropriate timing corresponding to the frequency of the input clock before the operational command is executed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
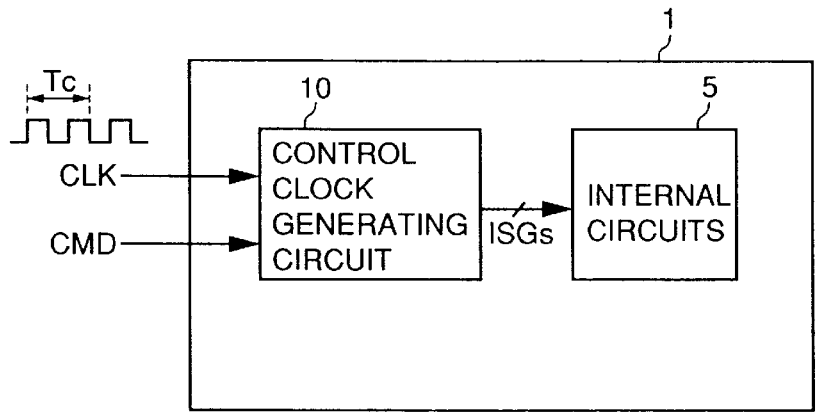
FIG. 1 is a schematic block diagram showing a configuration of a semiconductor device according to the first embodiment of the present invention.

Embodiments of the present invention will be described below in detail with reference to the drawings. Note that the same or corresponding portions are denoted by the same reference characters.

First Embodiment

Referring to FIG. 1, a semiconductor device 1 according to the first embodiment of the present invention includes internal circuits 5, and a control clock generating circuit 10 generating control clocks ISGs controlling an operational timing of the internal circuits. Semiconductor device 1 operates synchronously with an external clock CLK input from an external source to execute a command instructed by a command signal CMD. A period of external clock CLK hereinafter also simply referred to as an external clock period is denoted by Tc.

Control dock generating circuit 10 receives external dock CLK and command signal CMD to generate control clocks ISGs. Internal circuits 5 performs a predetermined operation for executing the command instructed by a command signal CMD, in response to control clocks ISGs. Control clock generating circuit 10 activates each of control clocks ISGs during a predetermined period using the timing of external clock as a reference.

Figure 2:
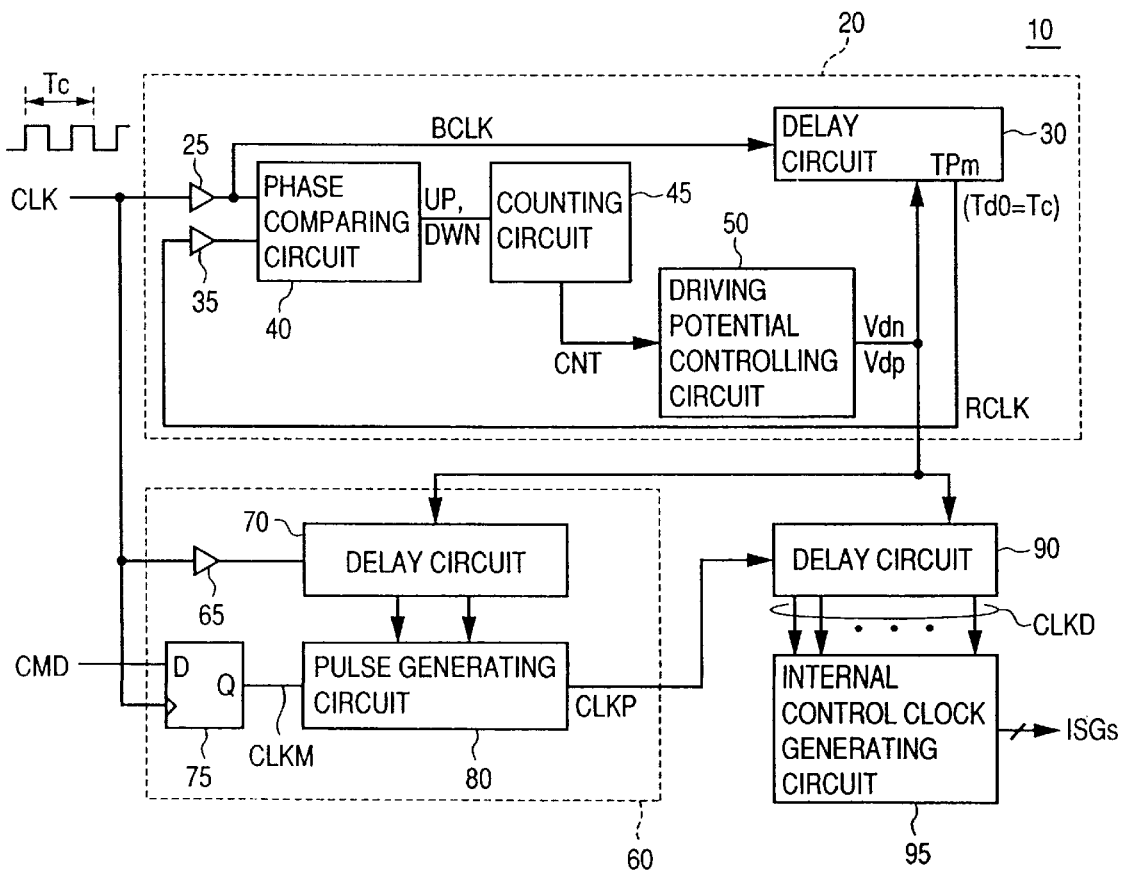
FIG. 2 is a block diagram showing a configuration of a control clock generating circuit 10 according to the first embodiment of the present invention.

Referring to FIG. 2, control clock generating circuit 10 according to the first embodiment includes a DLL circuit 20 for detecting an external clock period Tc, a reference clock pulse generating circuit 60 generating a reference clock pulse CLKP in response to external clock CLK and command signal CMD, a delay circuit 90 delaying reference clock pulse CLKP stepwise for outputting as clock CLKD, and an internal control clock generating circuit 95 generating control clocks ISGs in response to clock CLKD from delay circuit 90.

DLL circuit 20 includes an input buffer 25 receiving external clock CLK to output a buffer clock BCLK, a delay circuit 30 delaying buffer clock BCLK by Td0 to output a return clock RCLK, an input buffer replica 35 connected between delay circuit 30 and a phase comparing circuit 40, and phase comparing circuit 40 performing phase comparison between buffer clock BCLK and return clock RCLK which has passed through input buffer replica 35. Input buffer replica 35 is provided to give a delay time similar to that of input buffer 25 to return clock RCLK.

DLL circuit 20 further includes a counting circuit 45 integrating count data CNT in response to control signals UP and DWN output from phase comparing circuit 40, and a driving potential controlling circuit 50 controlling driving potentials Vdn and Vdp of the delay circuit in accordance with count data CNT.

Figure 3:
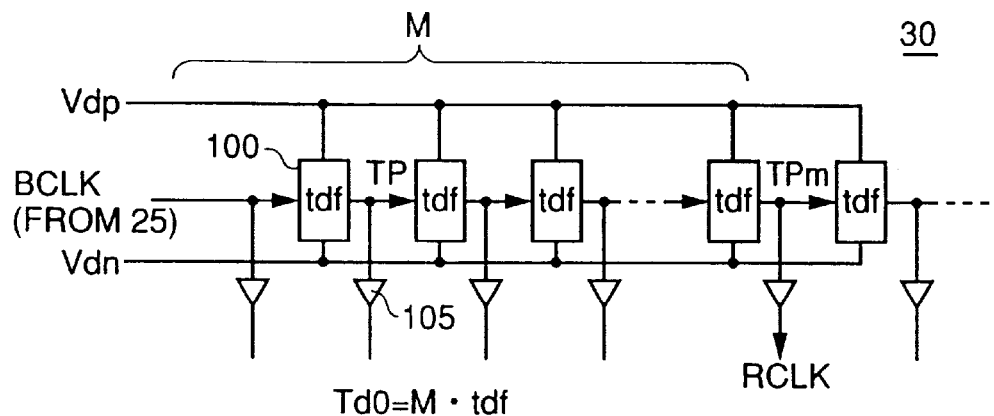
FIG. 3 is a block diagram showing a configuration of a delay circuit 30.

Referring to FIG. 3, delay circuit 30 includes a plurality of delay units 100 connected in series. Each delay unit 100 is driven by driving potentials Vdp and Vdn. Unit delay time tdf in each delay unit 100 varies in accordance with driving potentials Vdp and Vdn.

An output of each delay unit 100 can be taken out from each tap TP. A signal buffer 105 is further provided for amplifying the output of each tap.

Delay circuit 30 outputs return clock RCLK from a predetermined tap TPm. Tap TPm is determined to a point that has passed M (M is a natural number) delay units. Therefore, a delay of return clock RCLK to buffer BCLK is given by M×tdf.

Based on the result of the phase comparison between return clock RCLK and buffer block BCLK, a synchronous operation is performed in DLL circuit 20, and thus DLL circuit 20 will be in a locked state when delay time Td0= M×tdf in delay circuit 30 is equal to period Tc of external clock CLK, i.e., at the time point when Td0=Tc. Therefore, driving potentials Vdn and Vds are adjusted such that unit delay time in each delay unit is tdf=Tc/M in accordance with external clock period Tc.

Figure 4:
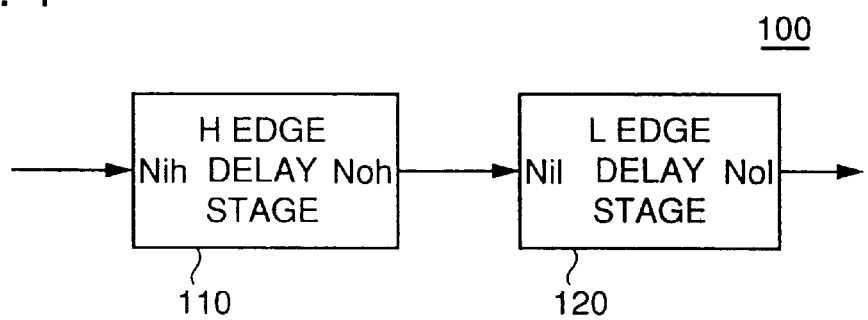
FIG. 4 is a block diagram showing a configuration of a delay unit 100.

Referring to FIG. 4, delay unit 100 includes an H edge delay stage 110 delaying a leading edge corresponding to a transition of an input signal from L level to H level, and an L edge delay stage 120 delaying trailing edge corresponding to a transition of the input signal from H level to L level.

Figure 5:
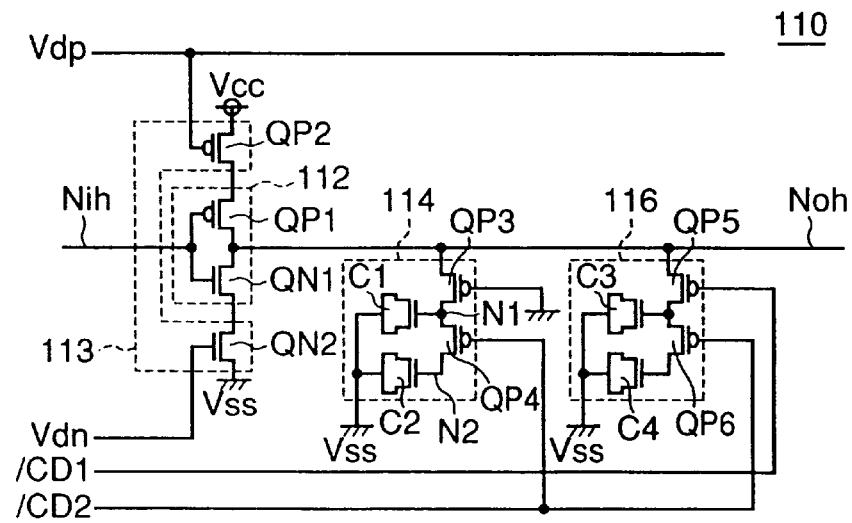
FIG. 5 is a circuit diagram showing a configuration of H edge delay stage 110.

Referring to FIG. 5, H edge delay stage 110 includes an inverter circuit 112 coupled between an input node Nih and an output node Noh, a current supplying circuit 113 supplying operating current of inverter circuit 112, and delay capacitance circuits 114 and 116 for coupling a delay capacitance to output node Noh in response to delay control signals /CD 1 and /CD2.

Inverter circuit 112 includes a P-type MOS transistor QP1 and an N-type MOS transistor QN1. Current supplying circuit 113 includes a P-type MOS transistor QP2 coupled between a power-supply node supplying a power-supply potential Vcc and inverter circuit 112, and an N-type MOS transistor QN2 coupled between a ground node supplying a ground potential Vss and inverter 112.

Driving potentials Vdp and Vdn are respectively input to the gates of transistors QP2 and QN2. This causes variation of the operating current of inverter circuit 112 due to driving potentials Vdp and Vdn, and also variation of signal transmitting speed of inverter circuit 112 from input node Nih to output node Noh in accordance with driving potentials Vdp and Vdn.

Delay capacitance circuit 114 includes a P-type MOS transistor QP3 coupled between output node Noh and node N1, a P-type MOS transistor QP4 coupled between nodes N1 and N2, an MOS capacitor C1 coupled between node N1 and the ground node, and an MOS capacitor C2 coupled between node N2 and the ground node.

The gate of transistor QP3 is connected to the ground node. Thus, transistor QP3 is turned on when the potential level of output node Noh is at H level and is turned off when it is at L level. Therefore, when the potential level of output node Noh transits from H level to L level occurs, i.e., the potential level of input node Nih transits from L level to H level, MOS capacitor C1 is connected to node Noh as a delay capacitance for further increasing unit delay time.

When, on the other hand, the signal level of output node Noh transits from L level to H level, i.e., an input of H edge delay stage 110 transits from H level to L level, MOS capacitor C1 is separated from output node Noh, so that the transition of input node Nih from H level to L level is propagated to output node Noh independent of delay capacitance.

Delay control signal /CD2 is input to the gate of transistor QP4. When delay control signal /CD2 is activated to L level, transistor QP4 is turned on in a manner similar to that of transistor QP3, so that MOS capacitor C2 also acts as a delay capacitance for output node Noh as in the case with MOS capacitor C1. This further increases the delay capacitance given by delay capacitance circuit 114.

Delay capacitance circuit 116 has a configuration similar to that of delay capacitance circuit 114, including P-type MOS transistors QP5 and QP6, and MOS capacitors C3 and C4. Transistors QP5 and QP6 respectively correspond to transistors QP3 and QP4 in delay capacitance circuit 114. Similarly, MOS capacitors C3 and C4 respectively correspond to MOS capacitors C1 and C2 in delay capacitance circuit 114.

Delay control signal /CD1 is input to the gate of transistor QP5, whereas delay control signal /CD2 is input to the gate of transistor QP6. This can stepwisely increase the capacitance value of the delay capacitance connected to node Noh, in response to delay control signals /CD1 and /CD2 in delay capacitance circuits 114 and 116.

Thus, in H edge delay stage 110, the variation of the signal level of input node Nih is propagated to output node Noh after a delay time in accordance with driving potentials Vdp and Vdn. Further, propagation delay of the leading edge from input node Nih to output node Noh can further be increased by controlling the number of MOS capacitors connected to output node Noh as delay capacitances, in response to delay control signals /CD1 and /CD2.

Figure 6:
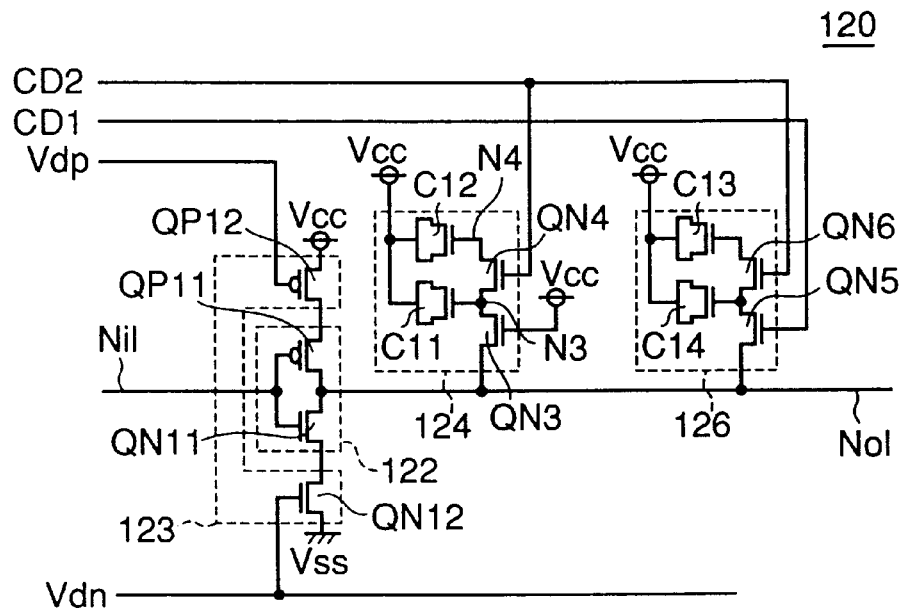
FIG. 6 is a circuit diagram showing a configuration of L edge delay stage 120.

Referring to FIG. 6, L edge delay stage 120 includes, as in the case with H edge delay stage 110, an inverter circuit 122 connected between an input node Nil and an output node Nol, a current supplying circuit 123 supplying operating current to inverter circuit 122, and delay capacitance circuits 124 and 126 for coupling output node Nol to a delay capacitance.

Current supplying circuit 123 includes a P-type MOS transistor QP12 electrically coupled between a power-supply node and inverter circuit 122 to receive a driving potential Vdp at the gate thereof, and an N-type MOS transistor QN12 electrically coupled between a ground node and inverter circuit 122 to receive a driving potential Vdn at the gate thereof.

Current supplying circuit 123 supplies, as in the case with current supplying circuit 113, operating current in accordance with driving potentials Vdp and Vdn to inverter circuit 122. This causes variation in speed by which inverter circuit 122 transmits a signal from input node Nil to output node Nol, in response to driving potentials Vdp and Vdn.

Delay capacitance circuit 124 includes an N-type MOS transistor QN3 coupled between output node Nol and node N3, an N-type MOS transistor QN4 coupled between nodes N3 and N4, and MOS capacitors C11 and C12 respectively coupled between nodes N3 and N4 and a power-supply node.

The gate of transistor QN3 is coupled to the power-supply node. Thus, transistor QN3 is turned off when the potential level of output node Nol is at H level whereas it is turned on when the potential level is at L level. Thus, when the potential level of output node Nol transits from L level to H level, i.e., when an input of edge delay stage 120 transits from H level to L level, MOS capacitor C11 is coupled to node Nol as a delay capacitance for further increasing unit delay time.

When, on the other hand, the signal level of output node Nol transits from H level to L level, i.e., when the potential level of input node Ni1 transits from L level to H level, MOS capacitor C11 is separated from output node No1, so that the transition of the potential level of input node Ni1 from H level to L level is propagated to output node No1 independent of the delay capacitance.

Delay control signal CD2 is input to the gate of transistor QN4. When delay control signal CD2 is activated to H level, transistor QN4 is turned on in a similar manner to that of transistor QN3, so that MOS capacitor C12 also acts as a delay capacitance for output node No1 in a manner similar to that of MOS capacitor C11. This can further increase the delay capacitance value given by delay capacitance circuit 124.

Delay capacitance circuit 126 has a configuration similar to that of delay capacitance circuit 124, including N-type MOS transistors QN5 and QN6, and MOS capacitors C13 and C14. Transistors QN5 and QN6 respectively correspond to transistors QN3 and QN4 in delay capacitance circuit 124. Similarly, MOS capacitors C13 and C14 respectively correspond to MOS capacitors C11 and C12 in delay capacitance circuit 114.

Delay control signal CD1 is input to the gate of transistor QN5, whereas delay control signal CD2 is input to the gate of transistor QN6. This can stepwise increase, in delay capacitance circuits 124 and 126, the capacitance value of the delay capacitance coupled to node No1, in response to delay control signals CD1 and CD2.

Thus, in L edge delay stage 120, variation of the signal level of input node Ni1 is propagated to output node No1 after a delay time period in accordance with driving potentials Vdp and Vdn. Further, the propagation delay of a trailing edge from input node Ni1 to output node No1 can further be increased by controlling the number of MOS capacitors coupled to output node No1 as delay capacitances.

By using complementary signals of delay control signals CD1, CD2 and /CD1, /CD2 respectively at H edge delay stage 110 and L edge delay stage 120, a delay capacitance coupled to an output node can be set to be common to H edge delay stage 110 and L edge delay stage 120.

As such, unit delay time tdf for each delay unit 100 varies in accordance with driving potentials Vdn and Vdp. Further, delay control signals CD1, CD2 and /CD1, /CD2 can be used to stepwisely increase the unit delay time.

Referring again to FIG. 2, when the phase of return clock RCLK is advanced compared to that of buffer clock BCLK, phase comparison circuit 40 activates control signal UP to increase delay time Td0 in delay circuit 30. When, on the other hand, the phase of return clock RCLK is delayed compared to that of buffer clock BCLK, phase comparison circuit 40 activates control signal DVVN to decrease delay time Td0 for delay circuit 30.

Count circuit 45 increases count data CNT one by one in response to the activation of control signal UP output from phase comparison circuit 40, and decreases count data CNT one by one in response to the activation of control signal DWN. Driving potential control circuit 50 controls driving potentials Vdn and Vdp in accordance with count data CNT.

Reference clock pulse generating circuit 60 includes an input buffer 65 receiving external clock CLK, a delay circuit 70 receiving external clock CLK via input buffer 65, a flip-flop 75 generating command clock CLKM in response to external clock CLK and command signal CMD, and a pulse generating circuit 80 generating reference clock pulse CLKP in response to an output of delay circuit 70 and command clock CLKM.

Delay circuit 90 stepwisely delays reference clock pulse CLKP per unit delay time tdf for outputting from each tap.

Internal control clock generating circuit 95 receives the output of each tap of delay circuit 90, and performs activation/inactivation of control clock ISGs at a predetermined timing based on reference clock pulse CLKP activated in response to external clock CLK.

Configurations of delay circuits 70 and 90 are similar to that of delay circuit 30 shown in FIG. 3. Each of delay circuits 70 and 90 includes a plurality of delay units connected in series, each delay unit being driven by driving potentials Vdn and Vdp that are same as the ones used in delay circuit 30.

Control of driving potentials Vdp and Vdn for controlling unit delay time tdf in delay unit 100 will now be described.

Figure 7:
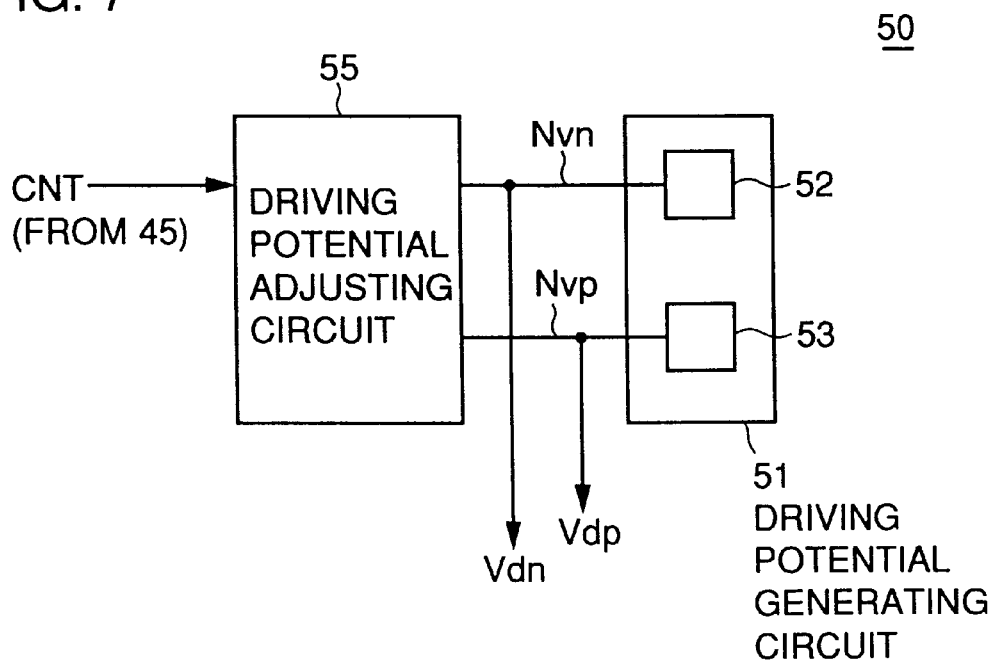
FIG. 7 is a block diagram showing a configuration of driving potential control circuit 50.

Referring to FIG. 7, driving potential controlling circuit 50 includes nodes Nvp and Nvn respectively supplying driving potentials Vdp and Vdn, a driving potential generating circuit 51 generating reference potentials Vdp and Vdn, and a driving potential adjusting circuit 55 adjusting driving potentials Vdp and Vdn in accordance with count data CNT from count circuit 45.

Driving potential generating circuit 51 includes a Vdn generating circuit 52 generating driving potential Vdn to node Nvn, and a Vdp generating circuit 53 generating driving potential Vdp to node Nvp.

Figure 8:
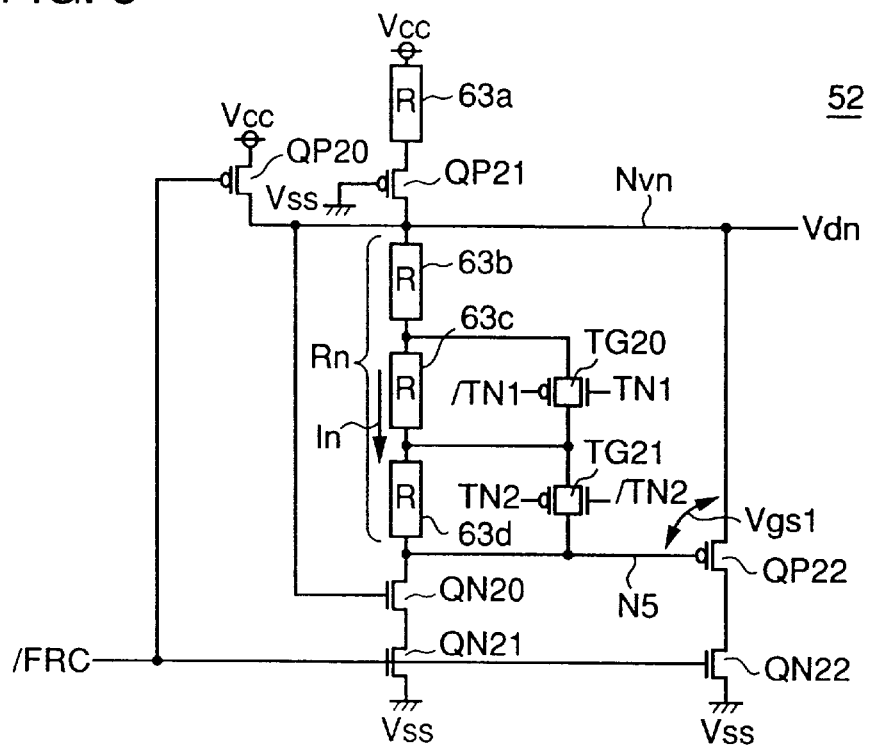
FIG. 8 is a circuit diagram showing a configuration of Vdn generating circuit 52.

Referring to FIG. 8, Vdn generating circuit 52 includes a resistance element 63a and a P-type MOS transistor QP21 coupled between powersupply node (Vcc) and node Nvn, resistance elements 63b, 63c and 63d connected in series between node Nvn and node N5, N-type MOS transistors QN20 and QN21 connected in series between node N5 and a ground node.

Transfer gates TG20 and TG21 are disposed in parallel with resistance elements 63c and 63d. Transfer gates TG20 and TG21 are turned on/off respectively in response to control signals TN1, /TN1 and control signals TN2, /TN2. Therefore, a resistance value Rn between node Nvn and node N5 is adjusted in response to control signals TN1, /TN1 and control signals TN2, /TN2.

Vdn generating circuit 52 further includes a P-type MOS transistor QP20 coupled between the power-supply node and node Nvn, and a P-type MOS transistor QP22 and an N-type MOS transistor QN22 connected in series between node Nvn and the ground node. Control signals /FRC is input to the gates of transistors QN21, QN22 and QP20. Thus, when control signal /FRC is activated to L level, node Nvn is connected to the power-supply node and, driving potential Vdn is fixed to power-supply potential Vcc.

When, on the other hand, control signal /FRC is inactivated to H level, transistors QN22 and QP22 are turned on, maintaining a voltage Vgs 1 between the gate and the source of transistor QP22, i.e. the difference in potentials between node N5 and node Nvn, at a constant value. Thus, current In flowing between node Nvn and the ground node is determined by resistance value Rn between node Nvn and node N5. The potential level of node Nvn is determined in accordance with the sum of a voltage drop generated at transistors QN20 and QN21 in which current In flows and a voltage drop generated at resistance value Rn by current In, so that driving potential Nvn will be an intermediate potential between power-supply potential Vcc and ground potential Vss set in response to control signals TN1, /TN1 and control signals TN2, /TN2.

Figure 9:
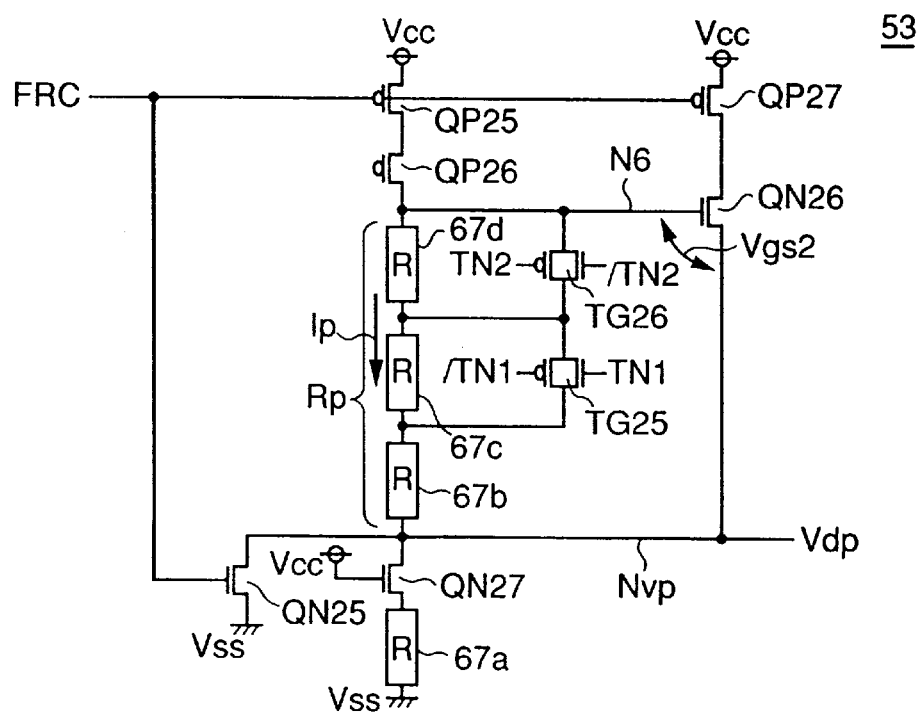
FIG. 9 is a circuit diagram showing a configuration of Vdp generating circuit 53.

Referring to FIG. 9, a circuit diagram showing a configuration of Vdp generating circuit 53 is shown. Vdp generating circuit 53 has a configuration similar to that of Vdn generating circuit 52, except that the connection of power-supply node Vcc and ground node Vss and the conductivity type of the MOS transistor are oppositely set.

Vdp generating circuit 53 includes P-type MOS transistors QP25 and QP26 connected in series between the power-supply node and node N6, and resistance elements 67b, 67c and 67d connected in series between node N6 and node Nvp.

Transfer gates TG25 and TG26 are respectively disposed in parallel with resistance elements 67c and 67d. Transfer gates TG25 and TG26 are turned on/off respectively in response to control signals TN1, /TN1 and control signals TN2, /TN2. Therefore, resistance value Rp between nodes Nvp and N6 is adjusted in accordance with control signals TN1, /TN1 and control signals TN2, /TN2.

Vdp generating circuit 53 further includes an N-type MOS transistor QN27 and a resistance element 67a connected in series between node Nvp and the ground node, a P-type MOS transistor QP27 and an N-type MOS transistor QN26 connected in series between the power-supply node and node Nvp, and an N-type MOS transistor QN25 connected between node Nvp and the ground node.

A control signal FRC is input to the gates of transistors QN25, QP25 and QP27. The gate of transistor QN26 is connected to node N6. The gate of transistor QN27 is connected to the power-supply node.

When control signal FRC is activated to H level, node Nvp is connected to the ground node by transistor QN25, so that driving potential Vdp is fixed to Vss.

When control signal FRC is inactivated to L level, transistors QP27 and QN26 are turned on as in the case with transistors QN22 and QP22 shown in FIG. 8, so that current Ip is set as Ip=Vgs2/Rp by a voltage Vgs2 between the gate and the source of transistor QN26 and resistance value Rp between node N6 and node Nvp. Thus, a voltage drop generated at a transistor QN27 and a resistance element 67a varies in accordance with control signals TN1, /TN1 and control signals TN2, /TN2 that are common to Vdn generating circuit 52, so that driving potential Nvp will be an intermediate potential between power-supply potential Vcc and ground potential Vss, which is set in accordance with control signals TN1, /TN1 and control signals TN2, /TN2 and which is lower than driving potential Vdn.

Figure 10:
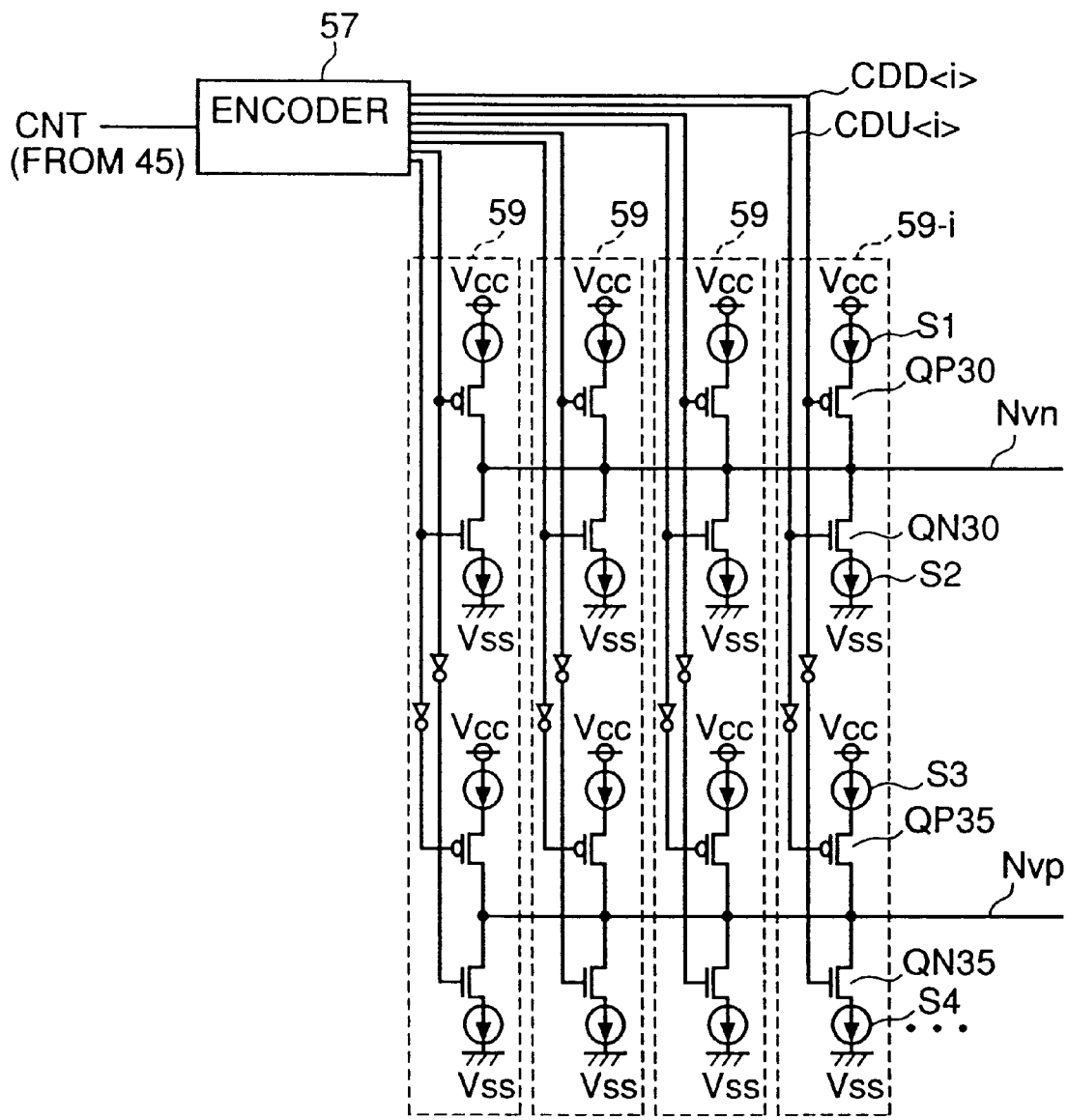
FIG. 10 is a circuit diagram showing a configuration of driving potential adjusting circuit 55.

Referring to FIG. 10, a driving potential adjusting circuit 55 includes driving potential adjusting units 59 for adjusting driving potentials Vdp and Vdn generated from driving potential generating circuit 51, and an encoder 57 controlling an operation of driving potential adjusting units 59 in accordance with count data CNT output from count circuit 45.

Encoder 57 generates control signals CDD and CDU for each of driving potential adjusting units 59. If generation times of control signal UP is I (I is a natural number) more than generation times of control signal DWN, i.e., if an integrated value indicated by count data CNT corresponds to "+I", encoder 57 activates control signal CDU for I driving potential adjusting units 59.

If, on the other hand, the generation times of control signal DWN is I more than the generation times of control signal UP, i.e., if the integrated value indicated by count data CNT is corresponding to "−I", encoder 57 activates control signal CDD for I driving potential adjusting units 59.

Each of driving potential adjusting units 59 has similar configuration and operation, and thus the operation of the ith (i is a natural number) driving potential adjusting unit 59-i controlled by control signals CDD<i> and CDU<i> is representatively described.

Driving potential adjusting unit 59-i includes a current source S1 and a P-type MOS transistor QP30 connected in series between a powersupply node and a node Nvn supplying driving potential Vdn, and an N-type MOS transistor QN30 and a current source S2 connected in series between node Nvn and a ground node. Driving potential adjusting unit 59-i further includes a current source S3 and a P-type MOS transistor QP35 connected in series between a power-supply node and node Nvp supplying driving potential Vdp, and an N-type MOS transistor QN35 and a current source S4 connected in series between node Nvp and a ground node.

Control signal CDU<i> activated corresponding to increase of a count value by control signal UP is input to the gate of transistor QN30. The inversion signal of control signal CDU<i> is input to the gate of transistor QP35. Thus, when CDU<i> is activated to H level, transistors QN30 and QP35 are turned on, lowering the potential level of node Nvn by current source S2 while raising the potential level of node Nvp by current source S3. As a result, driving potentials Vdp and Vdn are respectively raised and lowered, and thus operating current of inverter circuits 112 and 122 is reduced whereas unit delay time tdf is increased in each delay unit 110.

Control signal CDD<i>, activated corresponding to decrease of a count value due to control signal DWN, is input to the gate of transistor QP30. The inversion signal of control signal CDD<i> is input to the gate of transistor QN35. Thus, when control signal CDD<i> is activated to L level, transistors QP30 and QN35 are turned on, respectively raising and lowering the potential levels of nodes Nvn and Nvp by current sources S1 and S4. As a result, the potential level of driving potential Vdp is lowered while the potential level of Vdn is raised, so that the operating current of inverter circuits 112 and 122 is increased whereas unit delay time tdf is decreased in each delay unit 110.

Such a configuration allows driving potentials Vdp and Vdn to be controlled in accordance with the integrated value of the phase comparison result of phase comparing circuit 40, and thus unit delay time tdf for each delay unit 100 to be controlled. Driving potentials Vdn and Vdp are converged to such potential levels that delay time Td0 obtained by M delay units (=M×tdf) in delay circuit 30 is equal to time period Tc of external clock CLK.

Thus, period Tc of external clock CLK is detected by a synchronous control performed in DLL circuit 20. Driving potentials Vdn and Vdp adjusted in accordance with period Tc of external clock CLK are also supplied to delay circuit 70 in reference clock pulse generating circuit 60 and to delay circuit 90 for stepwisely delaying reference clock pulse CLKP.

Generation of reference clock pulse CLKP will now be described.

Figure 11:
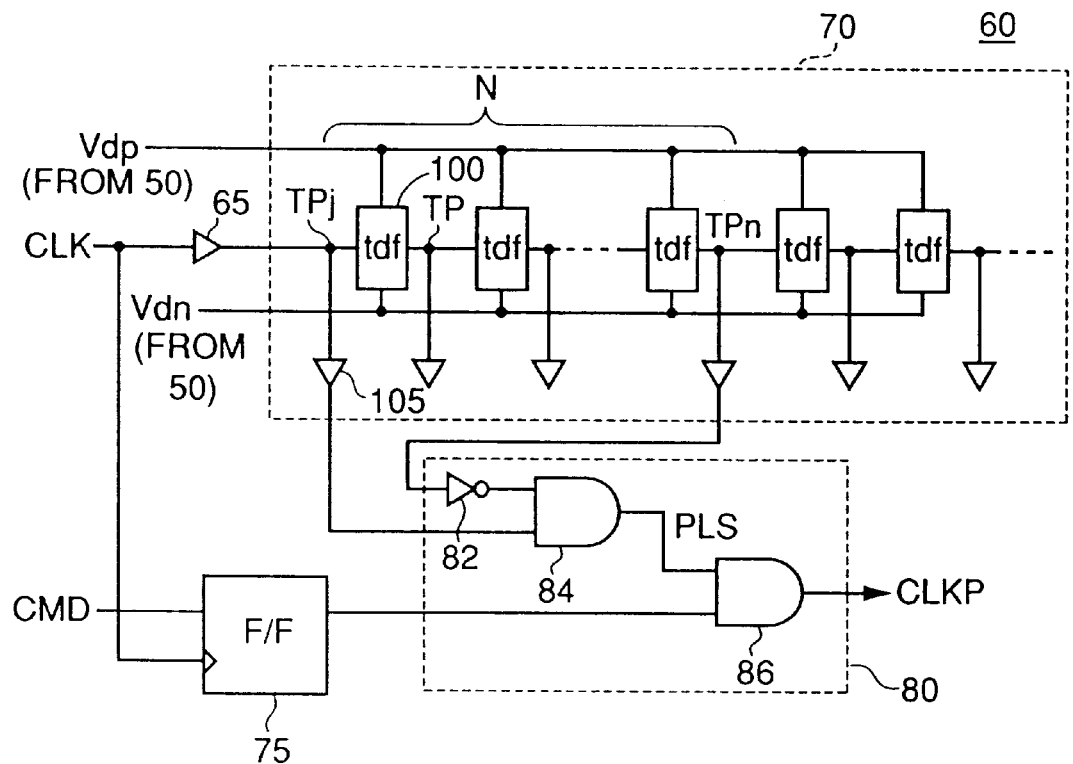
FIG. 11 is a block diagram showing a configuration of a reference clock pulse generating circuit 60.

Referring to FIG. 11, reference clock pulse generating circuit 60 includes an input buffer 65 receiving external clock CLK, a delay circuit 70 delaying external clock CLK which has passed through input buffer 65, a flip-flop 75 generating command clock CLKM, and a pulse generating circuit 80 generating reference clock pulse CLKP based on command clock CLKM and a signal taken out from delay circuit 70.

Delay circuit 70 has a configuration similar to that of delay circuit 30, and includes a plurality of delay units 100 connected in series. The configuration of delay unit 100 is as shown in FIGS. 4 to 6, so that the detailed description thereof will not be repeated.

Delay circuit 70 is also provided with a tap at an output of each delay unit, enabling the taking out of an external clock delayed stepwise per unit delay time tdf in delay unit 100. By setting the delay time of input buffer 65 to the value identical to that of input buffer 25, the outputs of the taps of delay circuit 70 will respectively be equal in phase to the outputs of the taps in delay circuit 30.

Outputs of predetermined two taps TPj and TPn in delay circuit 70 are taken out and transmitted to pulse generating circuit 80. N delay units are arranged between taps TPj and TPn, wherein N is a natural number smaller than M, the number of delay units through which return clock RCLK taken out from tap TPm passes.

Flip-flop 75 outputs a signal level of command signal CMD as command clock CLKM, in response to the leading edge of external clock CLK.

Pulse generating circuit 80 includes an inverter 82 inverting an output of tap TPn, a logic gate 84 outputting a result of AND logical operation between an output of inverter 82 and an output signal of tap TPj, and a logic gate 86 outputting an AND operation result between an output of logic gate 84 and command clock CLKM as reference clock pulse CLKP.

Figure 12:
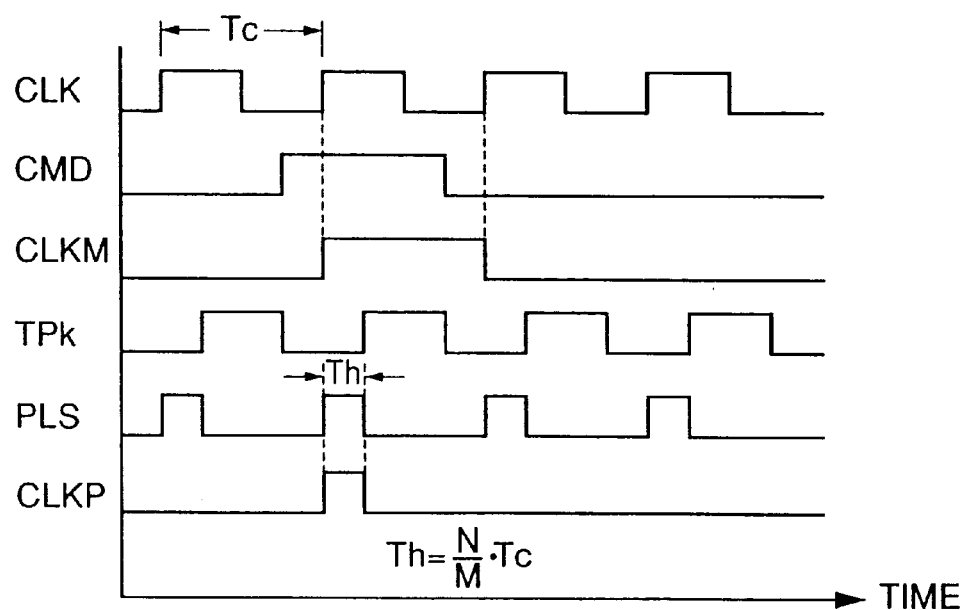
FIG. 12 is a timing chart illustrating a generation of a reference clock pulse CLKP.

Referring to FIG. 12, external clock CLK repeats transitions between H level and L level in a certain period Tc. Command signal CMD is activated to H level when execution of a command is externally instructed. Flip-flop 75 reflects the signal level of command signal CMD on command clock CLKM at each activation timing Geading edge) of internal clock CLK. Therefore, command clock CLKM is activated to H level for period Tc of external clock CLK, in a clock cycle in which the command is externally input.

A pulse signal PLS output from logic gate 84 has an activation period Th corresponding to delay time N×tdf generated by N delay units between taps TPj and Tdn. As has already been described, unit delay time tdf of the delay unit is determined by driving potentials Vdp and Vdn in accordance with period Tc of external clock CLK, and is given as unit delay time tdf=Tc/M. Therefore, activation period Th of pulse signal PLS given by N×tdf=(N/M)×Tc is also set in accordance with period Tc of external clock CLK.

Reference clock pulse CLKP is generated corresponding to pulse signal PLS in the activation period of command clock CLKM, i.e., only in a clock cycle in which a command is input. Thus, unnecessary power consumption can be prevented for control circuits in subsequent stages in clock cycles in which no commands are input.

As such, activation period Th of reference clock pulse CLKP is set in accordance with external clock period Tc such that it does not exceed external clock period Tc, and thus there is no tendency towards malfunctions such as internally generated control clocks connected to each other in a plurality of clock cycles, even though external clock CLK has a high frequency.

Generation of control clocks ISGs based on reference clock pulse CLKP will now be described.

Figure 13:
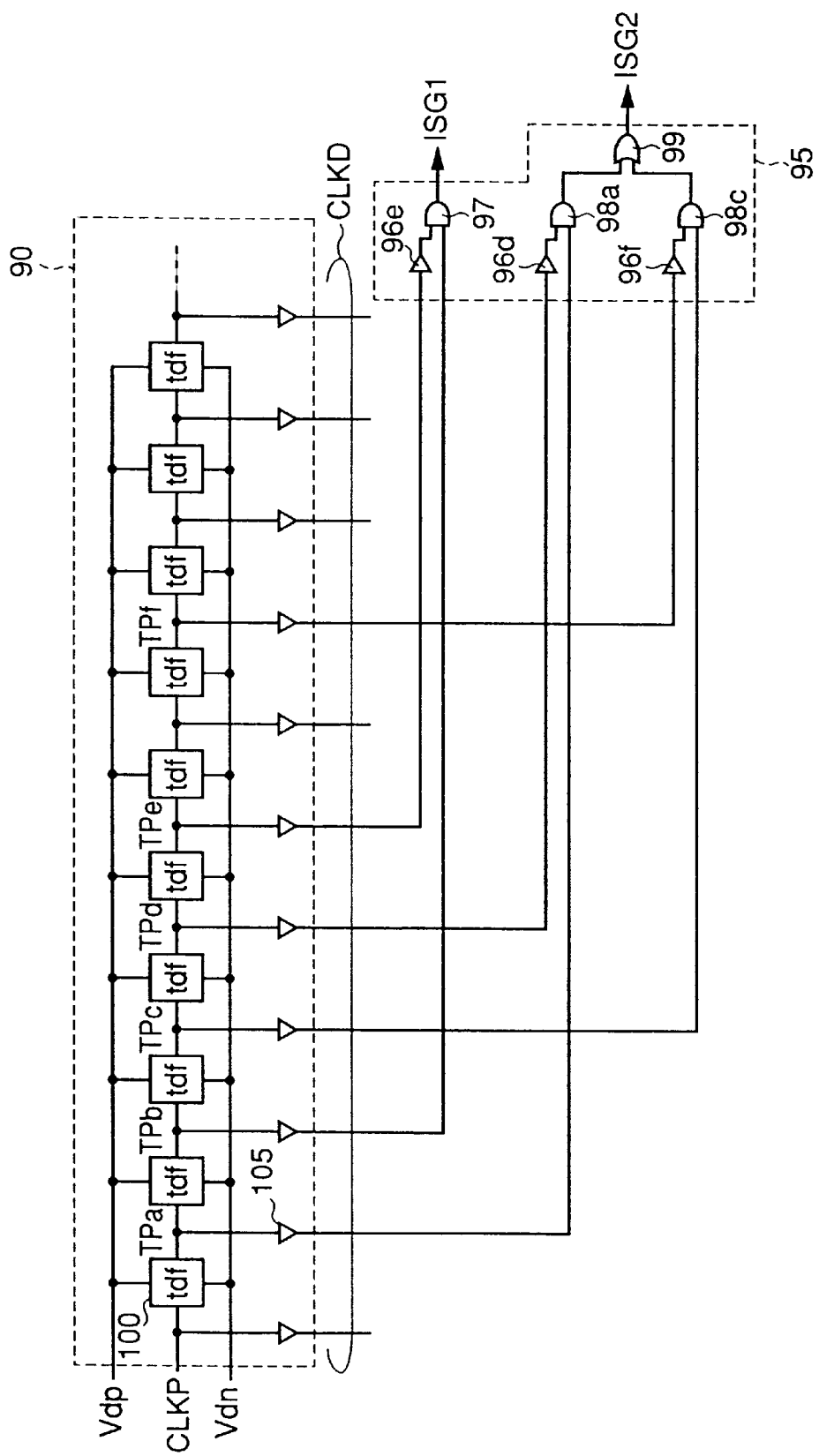
FIG. 13 is a circuit diagram illustrating a configuration of internal control clock generating circuit 95.

FIG. 13 is a circuit diagram illustrating a configuration of internal control clock generating circuit 95.

Referring to FIG. 13, delay circuit 90 has a configuration similar to those of delay circuits 30 and 70 described earlier, and includes a plurality of delay units 100 connected in series. The configuration of delay units 100 are as shown in FIGS. 4 to 6, so that the detailed description thereof will not be repeated. Delay circuit 90 delays input reference clock pulse CLKP stepwise per unit delay time tdf, and outputs delayed clock pulses CLKD from the respective taps TP.

Each delay unit 100 in delay circuit 90 is also controlled by driving potentials Vdn and Vdp that are common to delay circuits 30 and 70 so that unit delay time tdf is also set, as in the case with delay circuits 30 and 70, in accordance with the period of internal clock CLK. Therefore, activation and inactivation of a control clock for instructing an operational timing of internal circuits can appropriately be set, with a degree of freedom secured for timing setting in accordance with external clock period Tc.

FIG. 13 shows, as an example, generation of control clocks ISG1 and ISG2 of control clocks ISGs.

Internal control clock generating circuit 95 includes an inverter 96e inverting an output of a tap TPe, and a logic gate 97 outputting a result of AND logical operation between an output of inverter 96e and an output of tap TPb. Internal control clock generating circuit 95 further includes an inverter 96d inverting an output of tap TPd, a logic gate 98a outputting a result of AND logical operation between an output of inverter 96d and an output of tap TPa, an inverter 96f inverting a signal of tap TPf, a logic gate 98c outputting a result of AND logical operation between an output of inverter 96f and an output of tap TPc, and a logic gate 99 outputting a result of an OR logical operation between logic gate 98a and 98c. Logic gate 97 generates a control clock ISG1. Logic gate 99 generates a control clock ISG2 having a relatively long activation period.

Internal control clock generating circuit 95 generates a control clock based on a difference in timing between leading edges (H edges) of delayed clock pulses CLKD output from the respective taps, by combinations of inverters and AND gates.

Figure 14:
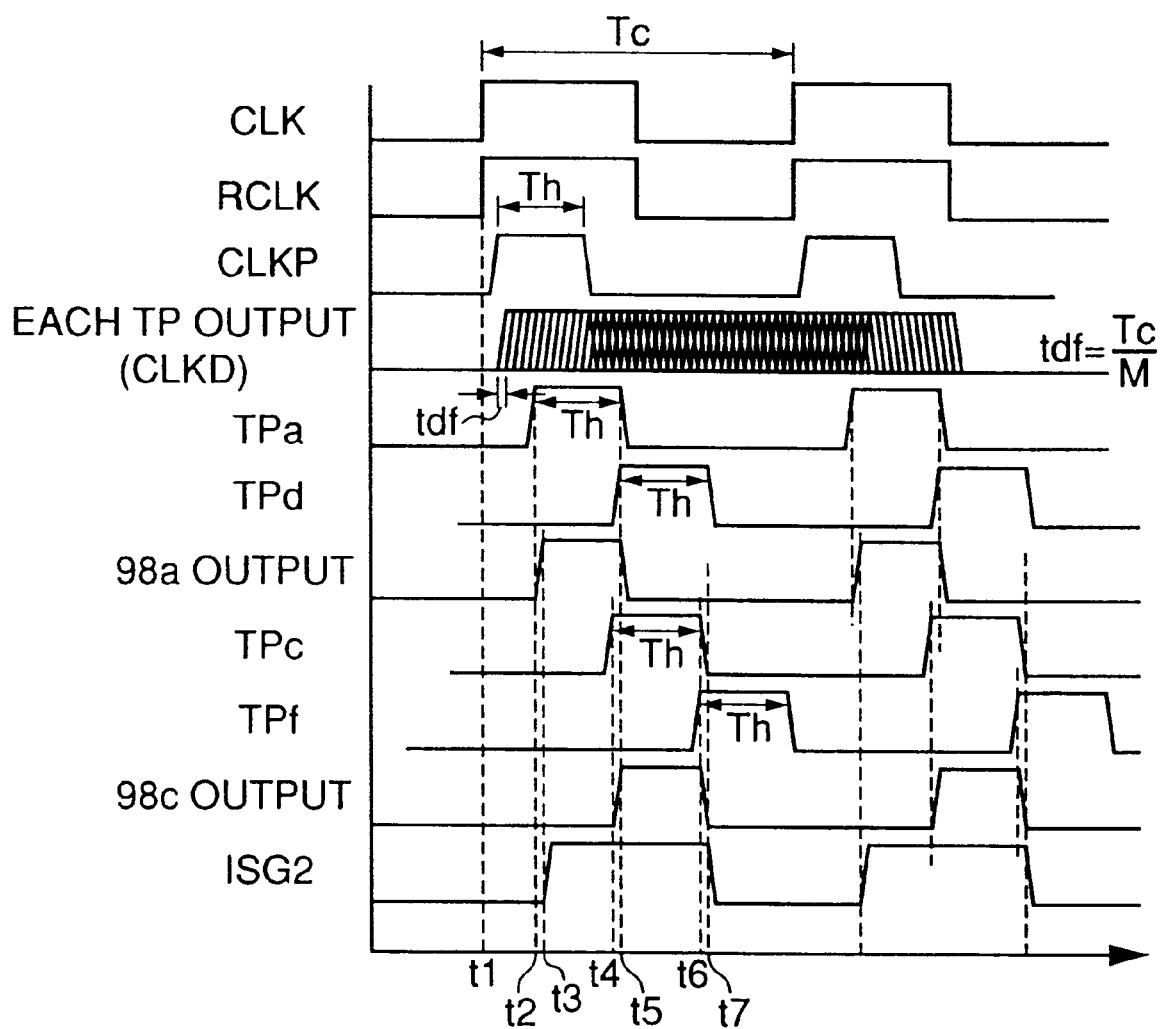
FIG. 14 is the first timing chart illustrating a generation of a control clock by control clock generating circuit 10.
Figure 15:
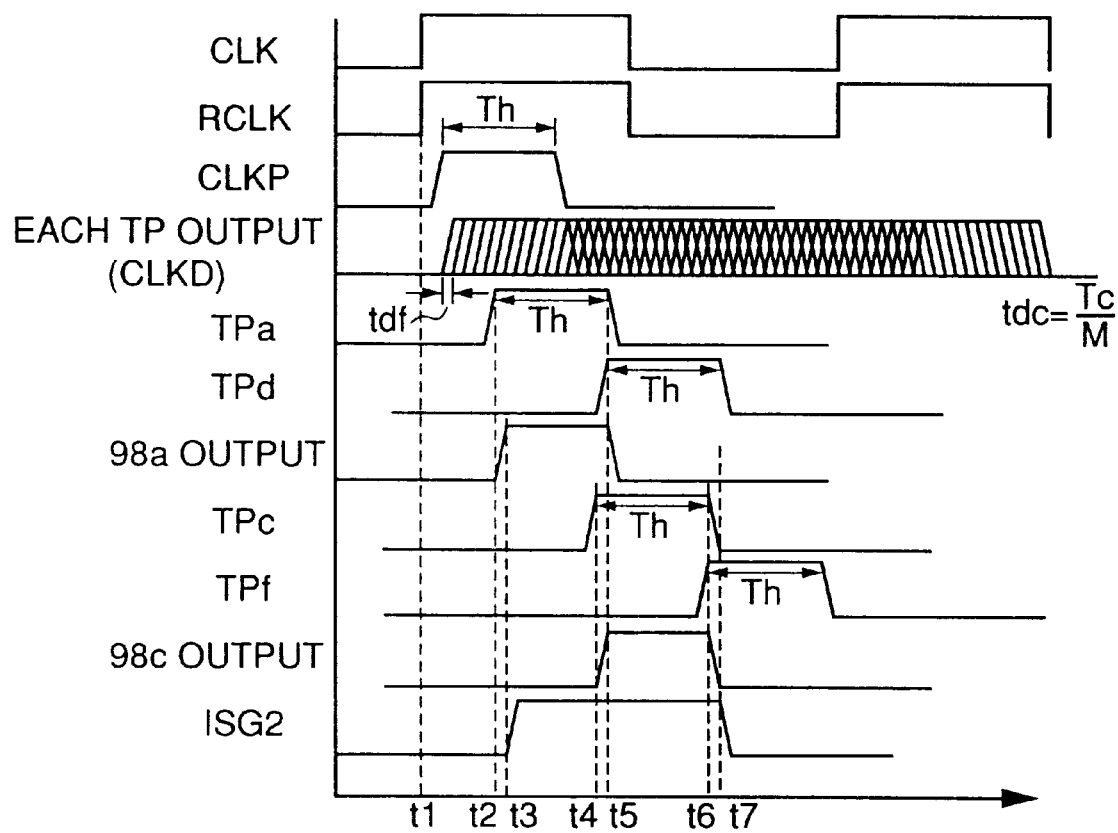
FIG. 15 is the second timing chart illustrating a generation of a control clock by control clock generating circuit 10.

FIGS. 14 and 15 are the first and second timing charts illustrating generation of control clocks by control clock generating circuit 10.

FIG. 14 shows an operation in the case where the operating frequency is high, that is where the time period of external clock CLK is relatively short, which was a problem in conventional control clock generating circuit 300.

Referring to FIG. 14, DLL circuit 20 generates a return clock RCLK synchronized with external clock CLK, in response to external clock CLK having period Tc. By synchronizing return clock RCLK with external clock CLK, driving potentials Vdn and Vdp of delay circuits 30, 70 and 90 are adjusted such that unit delay time tdf per one delay unit 100 will be tdf=Tc/M.

This determines pulse width Th of reference clock pulse CLKP generated in reference clock pulse generating circuit 60 to be Th=N×tdf=(N/M)×Tc in accordance with external clock period Tc, Th being smaller than Tc. Thus, reference clock pulse CLKP will always be inactivated in the same clock cycle, making generating operation of a control clock more stable. Reference clock pulse CLKD is activated in response to activation of external clock CLK at time t1 of the clock cycle in which a command is input.

Delayed dock pulse CLKD output from each tap of delay circuit 90 is provided by delaying reference clock pulse CLKP stepwise per unit delay time tdf.

As already described, unit delay time tdf is also set in accordance with external clock period Tc corresponding to the synchronous operation of DLL circuit 20. This can appropriately activate and inactivate a control clock, with a degree of freedom secured for the timing in accordance with the frequency of external clock CLK.

The outputs of taps TPa and TPd shown in FIG. 13 are signals provided by respectively delaying reference clock pulses CLKP, and the output of logic gate 98a is activated (H level) for a period from time t2 to t5, in accordance with the difference in timing of leading edges (H edges) of the respective outputs of taps TPa and TPd.

Similarly, the output of logic gate 98c is activated to H level for a period from time t4 to t6, in accordance with the difference in timing of leading edges (H edges) of these outputs of taps TPc and TPf.

Control clock ISG2 output from logic gate 99 is activated (H level) for a period from time t3 to t7 in accordance with the difference in timing of H edges of taps TPa and TPf, in response to the outputs of logic gates 98a and 98c.

Thus, in internal control clock generating circuit 95, control clocks are generated in accordance with the timing of the leading edge of the output signal of each tap, enabling more stable generation of internal control clocks. Further, by combining these configurations at the OR logic gate, a control clock to be activated for a long period of time can be generated.

FIG. 15 shows an operation of control clock generating circuit 100 in a case where the operating frequency is relatively low, i.e., where period Tc of external clock CLK is relatively long.

Referring to FIG. 15, it can be seen that pulse width Th of clock pulse CLKP and unit delay time tdf corresponding to stepwise delays provided to delayed clock pulses in delay circuit 90 are set longer than those in FIG. 14 in accordance with external clock period Tc. It can be seen that the outputs of taps TPa, TPd, TPc and TPf, and control clock ISG2 are the same as those in FIG. 14, and control clocks are stably generated.

As such, by altering at a constant ratio the pulse width of reference clock pulse CLKP which is a basis of generation of a control clock and unit delay time tdf of delay circuit 90 in accordance with external clock period Tc, the control clock can be synchronized with external clock CLK to be stably generated.

Second Embodiment

In the second embodiment, a configuration in which the unit delay time in each delay unit can more finely be set.

Figure 16:
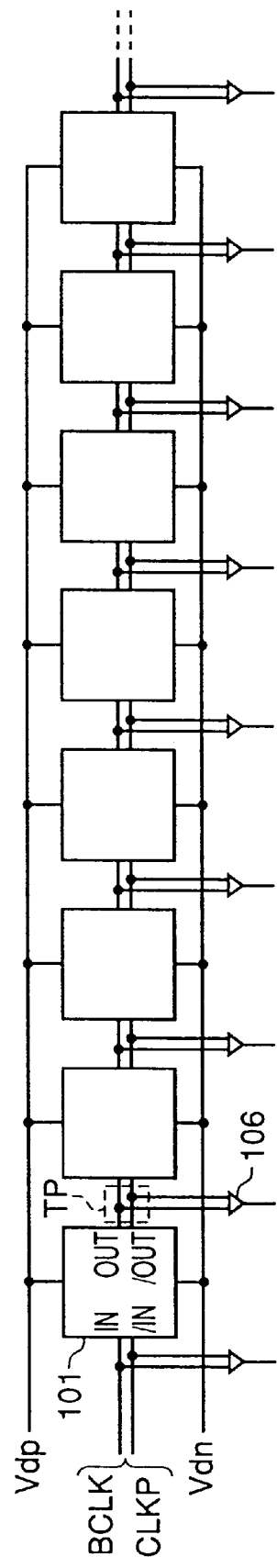
FIG. 16 is a block diagram showing a configuration of a delay circuit according to the second embodiment of the present invention.

FIG. 16 is a block diagram showing a configuration of a delay circuit according to the second embodiment.

In FIG. 16, configurations of delay circuits 31, 71 and 91 according to the second embodiment, provided in place of delay circuits 30, 70 and 90 are shown.

Referring to FIG. 16, each delay circuit according to the second embodiment includes a plurality of delay units 101 connected in series.

Each of delay units 101 transmits a delaying clock at a small amplitude as a complementary clock. Each delay unit 101 enables finer setting of unit delay time tdf by making the amplitude of the clock to be delayed small.

It is noted that, in a control clock generating circuit according to the second embodiment, external clock CLK is input as a complementary clock, and the amplitude thereof is made smaller by input buffers 25 and 65 shown in FIG. 2. The configurations and operations of the other portions of the control clock generating circuit is similar to the ones in the first embodiment, so that the detailed description thereof will not be repeated.

Figure 17:
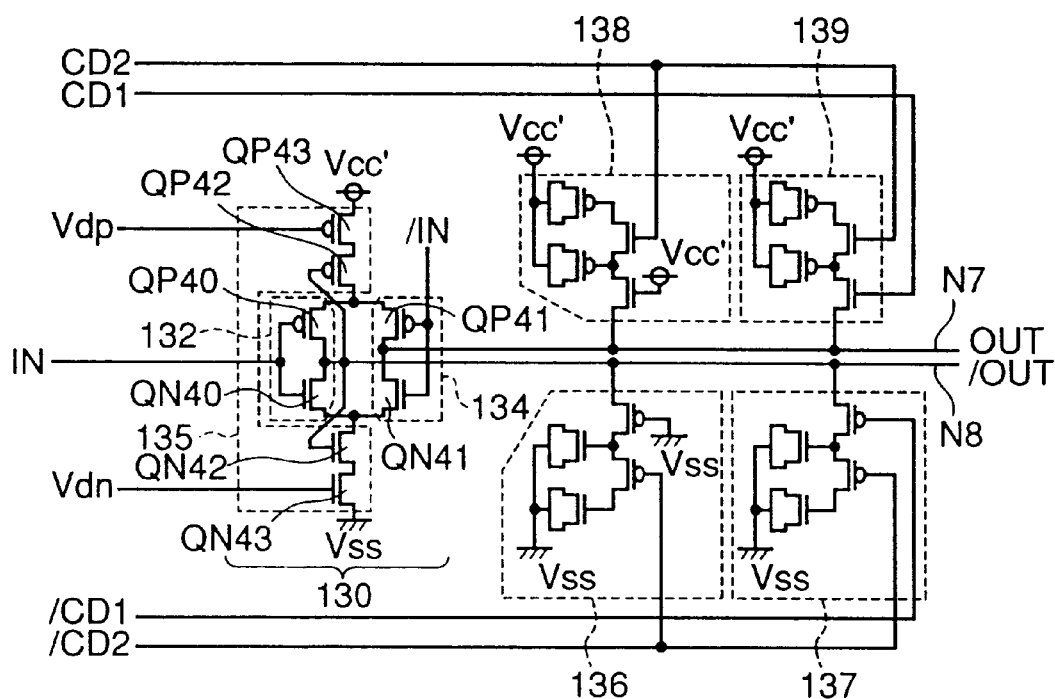
FIG. 17 is a circuit diagram showing a configuration of a delay unit 101 for delaying a complementary clock with a small amplitude.

Referring to FIG. 17, each of delay units 101 includes a signal transmitting unit 130 respectively transmitting complementary clocks IN and /IN input to output nodes N7 and N8, delay capacitance circuits 138 and 139 for coupling a delay capacitance to output node N7, and delay capacitance circuits 136 and 137 for coupling the delay capacitance to output node N8. Signal transmitting unit 130 includes an inverter circuit 132 inverting one complementary clock IN for transmitting to output node N8, an inverter circuit 134 inverting the other complementary clock /IN for transmitting to output node N7, and a current supplying circuit 135 supplying operating current to inverter circuits 132 and 134.

Inverter circuit 132 includes a P-type MOS transistor QP40 and an N-type MOS transistor QN40, either one of which is selectively turned on in response to a signal level of clock IN. Similarly, inverter circuit 134 includes a P-type MOS transistor QP41 and an N-type MOS transistor QN41, either one of which is selectively turned on in response to a signal level of clock /IN.

Current supplying circuit 135 includes P-type MOS transistors QP42 and QP43 connected between a low power-supply node supplying a powersupply potential Vcc' corresponding to the small amplitude of the complementary clock and inverter circuits 132 and 134, and also includes N-type MOS transistors QN42 and QN43 connected in series between a ground node and inverter circuits 132 and 134. Driving potentials Vdn and Vdp are respectively input to the gates of transistors QN43 and QP43. Therefore, current flowing in transistors QN43 and QP43 are set in a manner similar to the case with H edge delay stage 110 and L edge delay stage 120 shown in FIGS. 5 and 6.

The gates of transistors QN42 and QP42 are connected to output node N8. Thus, when the signal level of clock IN transits from L level to H level, transistor QN40 is turned on, and the potential level of output node N8 starts to be lowered. Accordingly, the gate potentials of transistors QN42 and QP42 are lowered, so that current-supplying power of transistor QN42 is also lowered whereas current-supplying power of transistor QP42 is increased. Then, the signal level of clock /IN transits from H level to L level, turning on transistor QP41. When this occurs, output node N7 is charged at high speed by transistor QP41 due to the increase of current-supplying power of transistor QP42, and the leading edge of output node IN from L level to H level is transmitted at high speed to output node N7.

When, on the other hand, clock IN transits from H level to L level, whereas clock /IN transits from L level to H level, transistors QP40 and QN41 are respectively turned on in inverter circuits 132 and 134. The potential level of output node N8 is raised in response to the turning-on of transistor QP40, the current-supplying power of transistor QN42 is accordingly increased, whereas the current-supplying power of transistor QP42 is decreased. As a result, transistor QN41 in inverter circuit 134 discharges output node N7 with higher speed due to the increase of the current-supplying power of transistor QN42, and thus the trailing edge of clock IN can be transmitted at high speed to output node N7.

Therefore, in delay units 101, complementary clocks IN and /IN can be transmitted at high speed respectively as clocks OUT and /OUT to output nodes N7 and N8.

Delay capacitance circuits 136 and 137 have configurations similar to delay capacitance circuits 114 and 116 described with reference to FIG. 5, so that the detailed description thereof will not be repeated. Similarly, delay capacitance circuits 138 and 139 have configurations similar to delay capacitance circuits 124 and 126 described with reference to FIG. 6. Thus, the unit delay time of delay units 101 can be increased stepwise in accordance with delay control signals CD1, /CD1 and CD2, /CD2.

Referring again to FIG. 16, a differential amplifier 106 is provided at tap TP provided at the output of each delay unit.

This enables taking out of the complementary clock with small amplitude, delayed by each delay unit, from a tap as a single clock signal with normal amplitude similar to the one in the first embodiment.

Differential amplifier 106 may be, for example, a general current mirror amplifier.

Modification of the Second Embodiment

The modification example of the second embodiment is different from the configuration of control clock generating circuit 10 described in the first embodiment in the respect that delay circuits 32, 72 and 92 are provided in place of delay circuits 30, 70 and 90. The other parts are similar to those in the second embodiment, so that the detailed descriptions thereof will not be repeated.

Figure 18:
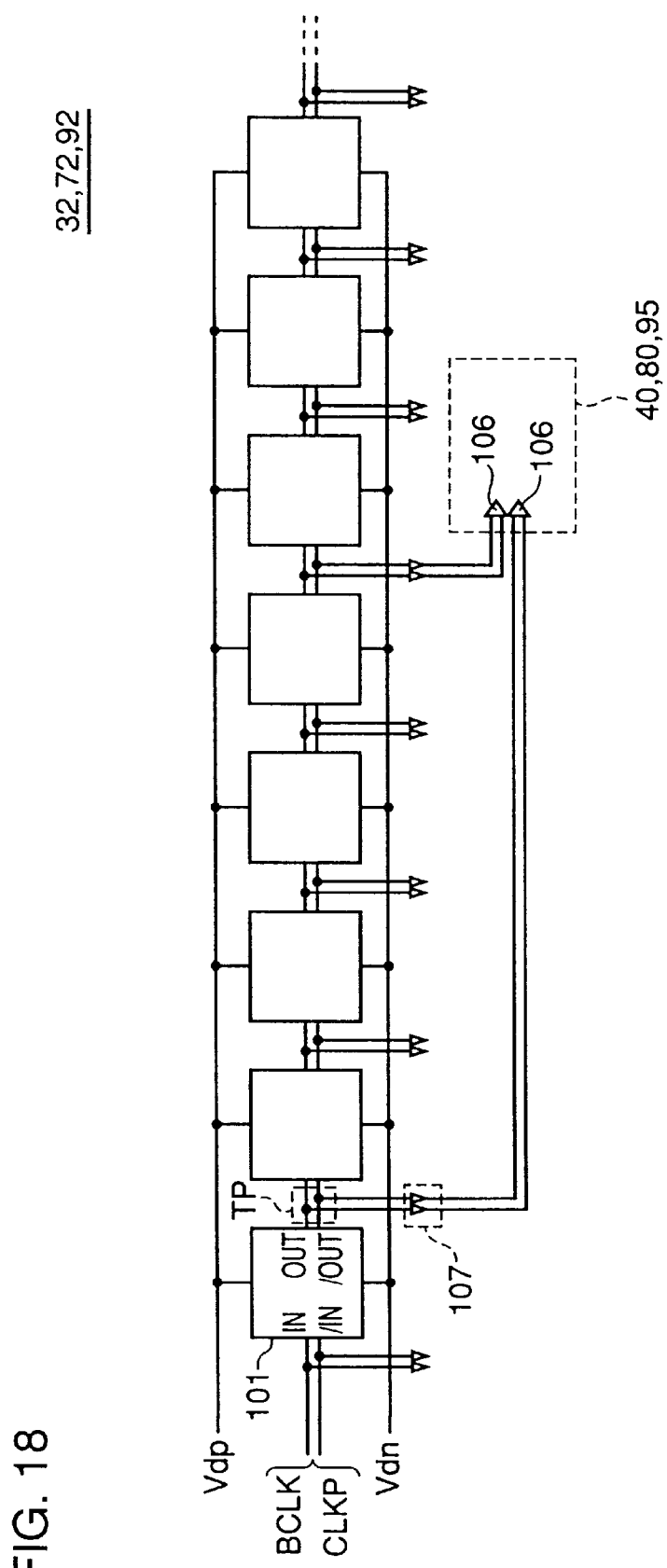
FIG. 18 is a block diagram showing a configuration of a delay circuit according to a modification of the second embodiment.

Referring to FIG. 18, delay circuits 32, 72 and 92 are also provided with delay units 101 shown in FIG. 17 connected in series. In the alternative example of the second embodiment, at each tap of the delay circuits, an output of a delay unit is taken out as a complementary clock with small amplitude for supplying to the subsequent circuits. An amplifier 107 is provided corresponding to each tap TP.

Figure 19:
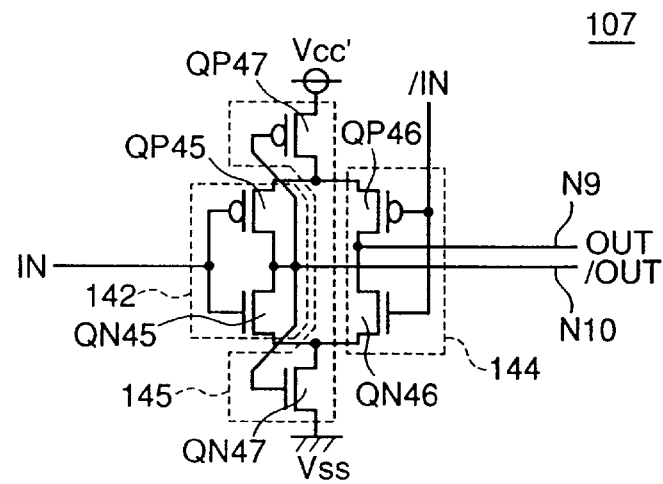
FIG. 19 is a circuit diagram showing a configuration of an amplifier 107.

Referring to FIG. 19, amplifier 107 has a configuration similar to that of signal transmitting unit 130 in delay unit 101 for small amplitude shown in FIG. 16.

Amplifier 107 includes an inverter circuit 142 inverting one complementary clock IN for outputting to output node N10, an inverter circuit 144 inverting the other complementary clock /IN for transmitting to output node N9, and a current-supplying circuit 145 supplying operating current to inverter circuits 142 and 144.

Inverter circuit 142 includes a P-type MOS transistor QP45 and an N-type MOS transistor QN45, either one of which is selectively turned on in accordance with the signal level of clock IN. Inverter circuit 144 includes a P-type MOS transistor QP46 and an N-type MOS transistor QN46, either one of which is selectively turned on in accordance with the signal level of clock /IN.

Current-supplying circuit 145 includes a P-type MOS transistor QP47 connected between a low power-supply potential node supplying a low power-supply potential Vcc' corresponding to the small amplitude and inverter circuits 142 and 144, and an N-type MOS transistor QN47 connected between a ground node and inverter circuits 142 and 144. The gates of transistors QP47 and QN47 are connected to output node N10. Thus, when clock IN transits from L level to H level, transistors QN45 and QP46 are respectively turned on in inverter circuits 142 and 144. The potential level of output node N10 is lowered whereas current driving power of transistor QP47 is increased, in response to the turn-on of transistor QN45. Thus, node N9 is charged to H level at high speed by transistor QP46. Therefore, the transition of clock IN from L level to H level can be transmitted at high speed to output node N9.

When, on the other hand, clock IN transits from H level to L level, i.e., clock /IN transits from L level to H level, transistors QP45 and QN 46 are respectively turned on in inverter circuits 142 and 144. The potential level of output node N10 is raised whereas the current driving power of transistor QN47 is increased, in response to the turn-on of transistor QP45. Accordingly, in inverter circuit 144, discharge operation of output node N9 to L level by transistor QN46 is performed at high speed. This allows the trailing edge of clock IN from H level to L level to be transmitted at high speed to output node N9.

By using such amplifier 107, a complementary clocks can be amplified at high speed at each tap TP, to be supplied to each of the subsequent circuits.

Referring again to FIG. 18, differential amplifier 106 is arranged in pulse generating circuit 80 or internal control clock generating circuit 95 arranged in later stages of delay circuits 32, 72 and 92. As for differential amplifier 106, as already described, a current mirror type may be employed as a general differential amplifier.

Thus, delayed clock pulse CLKD output from each tap in each delay circuit can remain as a complementary clock and be transmitted to a subsequent circuit by providing differential amplifier 106 in the subsequent circuit utilizing the output of each tap. When the complementary clock is converted into a single clock by the differential amplifier, differential-amplifying operation is performed so that an in-phase component included in each one of the complementary clock will be canceled.

Thus, noise superposed upon the signal transmission from each tap TP to the subsequent circuit will be canceled at the time of differential amplification. This allows internal control clock generating circuit 95 generating a control clock to be arranged in the vicinity of internal circuits 5 to generate the control clock with accurate timing that eliminates to high degree the effects of the noise.

Third Embodiment

In the third embodiment, a configuration of a control clock generating circuit detecting an external dock period within predetermined L clock cycles (L is a natural number).

Figure 20:
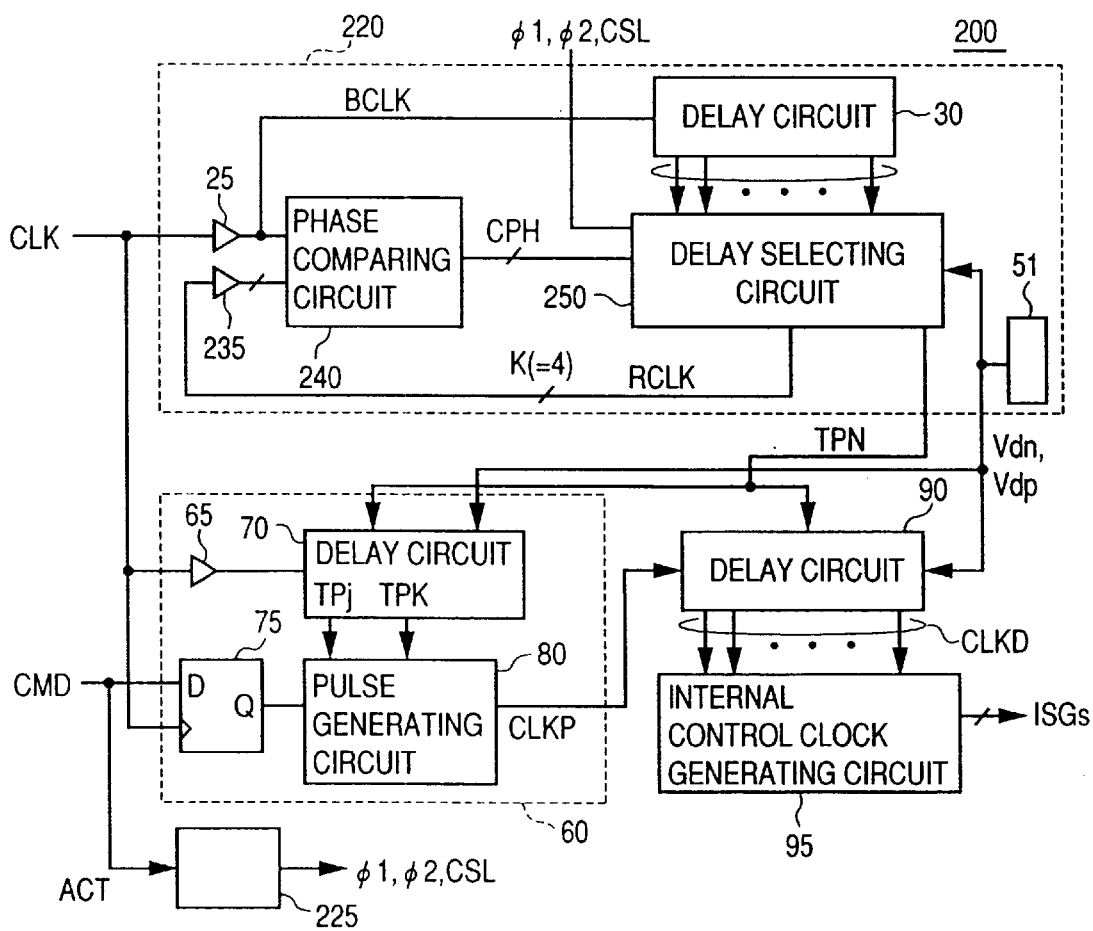
FIG. 20 is a block diagram showing a configuration of a control clock generating circuit according to the third embodiment of the present invention.

Referring to FIG. 20, control clock generating circuit 200 according to the third embodiment of the present invention is different from control clock generating circuit 10 shown in FIG. 2, in that DLL circuit 220 is included in place of DLL circuit 20, and that a synchronization detecting control circuit 225 is further included.

DLL circuit 220 detects external dock period Tc within L clock cycles of an external clock CLK, and generates clock period information TPN reflecting the detected result. A reference clock pulse generating circuit 60 generating a reference clock pulse CLKP and a delay circuit 90 delaying reference clock pulse CLKP stepwise to output delay clock pulse CLKD respectively set pulse width Th of reference clock pulse CLKP and stepwise unit delay time tdf of delayed clock pulse CLKD based on clock period information TPN. Internal control clock generating circuit 95 generates, as in the case with the first and second embodiments, control clocks ISGs in accordance with delayed clock pulses CLKD.

In the third embodiment, an actual operation command is input to internal circuits to which control clocks ISGs are supplied L clock cycles after a preliminary command for activating the internal circuits is input. Considering a case where the internal circuit is a memory circuit as an example, the preliminary command corresponds to an activate command ACT instructing start of row selecting operation of the memory circuit, whereas the operation command corresponds to, for example, a write command WRT instructing data writing to a selected memory cell.

Synchronization detection control circuit 225 receives command signal CMD instructing activate command ACT to generate control signals φ1, φ2 and a selection signal CSL.

DLL circuit 220 includes an input buffer replica 235 and a phase comparing circuit 240 in place of input buffer replica 35 and phase comparing circuit 40 provided in DLL circuit 20. DLL circuit 220 is provided with K (K is a natural number equal to or greater than 2) return clocks RCLK to perform phase comparison for K in parallel, in order to detect the external clock period in a short period of time.

DLL circuit 220 further includes a delay selecting circuit 250 in place of counter circuit 45 and driving potential adjusting circuit 55 provided in DLL circuit 20.

Though the configuration of delay circuit 30 may be similar to that in the first embodiment, the external clock period is detected with fixed unit delay time of each delay unit 100 in delay circuit 30 in DLL circuit 220, so that, in driving potential generating circuit 51, control signals FRC and /FRC shown in FIGS. 8 and 9 are activated respectively to H level and L level, to fix driving potentials Vdn and Vdp.

Delay selecting circuit 250 selects K taps from a plurality of taps in delay circuit 30 to take out K return clocks, while it generates clock period information TPN based on a phase comparison result between the return clock and buffer clock BCLK.

Figure 21:
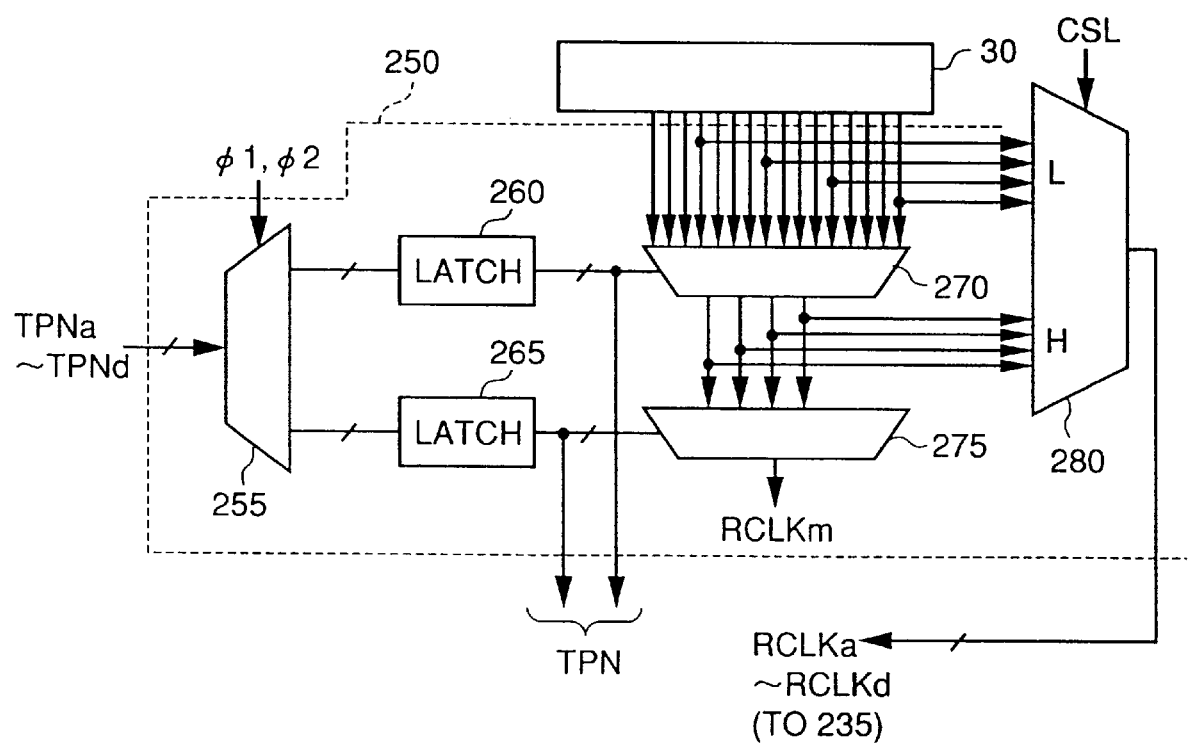
FIG. 21 is a block diagram showing a configuration of a delay selecting circuit 250.

FIG. 21 is a block diagram showing an example configuration of delay selecting circuit 250. FIG. 21 shows, as an example, a configuration for detecting an external clock period in 2 clock cycles (L=2) in the case of K×4.

Referring to FIG. 21, delay selecting circuit 250 includes a selector 270 selecting K (4) taps from taps TP1 to TP15 ($K^L$=16) in delay circuit 30; a multiplexer 280 outputting either one of predetermined K (4) taps of taps TP1 to TP15 or four tap outputs selected by selector 270, as return clocks RCLKa to RCLKd, in response to selection signal CSL; and a selector 275 outputting one tap output of four taps selected by selector 270 as a monitor clock RCLKm. Selection signal CSL is set to L level in a predetermined clock cycle after a preliminary command of activate command ACT is input (hereinafter referred to as the first clock cycle), whereas selection signal CSL is set to H level in a clock cycle subsequent to the first clock cycle (hereinafter referred to as the second clock cycle).

Phase comparing circuit 240 performs determinating operation based on the respective phase comparison results CPHa to CPHd between return clocks RCLKa to RCLKd and buffer clock BCLK, to output clock period information TPNa to TPNd.

Delay selecting circuit 250 further includes a demultiplexer 255 selectively transmitting clock period information TPNa to TPNd from phase comparing circuit 240 to either one of determination latch circuits 260 and 265 in accordance with control signals φ1 and φ2, and latch circuits 260 and 265 holding clock period information TPNa to TPNd transmitted via demultiplexer 255. Selecting operations in selectors 270 and 275 are performed based on clock period information TPNa to TPNd held in each of latch circuits 260 and 265.

Figures 22, 23:
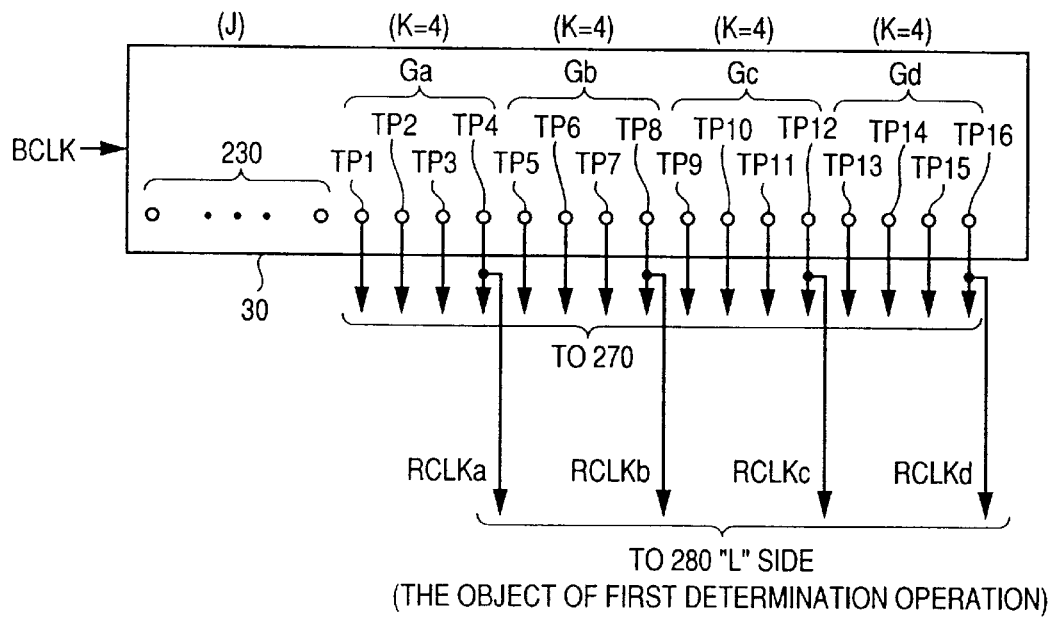
FIG. 22 schematically illustrates a selecting operation by delay selecting circuit 250.
FIG. 23 illustrates a determining operation by a phase comparing circuit 240.

FIG. 22 is a schematic view illustrating selecting operation by delay selecting circuit 250.

Referring to FIG. 22, buffer clock BCLK input to delay circuit 30 is delayed stepwise per unit delay time tdf, by each of preceding J delay units 230 and succeeding 16 delay units. Outputs of the succeeding delay units are taken out by taps TP1 to TP15. Therefore, a delay by an output of the hth (is a natural number from 1 to 15) tap TPh will be (J+h)×tdf.

DLL circuit 220 detects a tap, of taps TP1 to TP15, having a delay (J+h)×tdf with the smallest difference from external clock period Tc, to detect external clock period Tc.

Taps TP1 to TP15 respectively corresponding to $K^2$=16 selected delay units are divided into four groups Ga to Gd, each having four taps, corresponding to the number K of the return clocks. In each group, taps TP4, TP8, TP12 and TP16 with the largest delays are input as predetermined taps to "L" side of multiplexer 280.

In the first clock cycle, outputs of taps TP4, TP8, TP12 and TP16 are input to phase comparing circuit as return clocks RCLKa to RCLKd respectively. Phase comparing circuit 240 performs the first determining operation based on the respective phase comparison results between return clocks RCLKa to RCLKd and buffer clock BCLK, and determines which of the four groups Ga to Gd includes a tap outputting a delay closest to external clock period Tc.

Referring to FIG. 23, the phase comparison result corresponding to each return clock is indicated as L level if the phase of the return clock is more advanced compared to buffer clock BCLK, and indicated as H level if the phase of the return clock is more delayed.

As shown in FIG. 23, the respective phase comparison results between each of return clocks RCLKa to RCLKd and buffer clock BCLK are determined by cases 1 through to 5 whichever is applicable. In the first determining operation, the clock period information corresponding to a group including the tap outputting a delay closest to external clock period Tc among clock period information TPNa to TPNd respectively corresponding to groups Ga to Gd is selectively set to H level.

Referring again to FIG. 21, clock period information TPNa to TPNd generated in the first determining operation are transmitted to latch circuit 260 via demultiplexer 255 and is held therein.

In the second clock cycle, selector 270 selects four taps corresponding to the groups selected based on clock period information TPNa to TPNd held in latch circuit 260. The outputs of the four taps selected by selector 270 are transmitted to selector 270 and "H" side of multiplexer 280.

In the second clock cycle, multiplexer 280 inputs the outputs of the four taps selected by selector 270, i.e., the outputs of the taps corresponding to the groups selected at the time of the first determining operation, to phase comparing circuit 240 respectively as return clocks RCLKa to RCLKd.

Similarly, phase comparing circuit 240 performs the second determining operation based on respective phase comparison results CPHa to CPHd resulted from the comparison between each of return clocks RCLKa to RCLKd and buffer clock BCLK, to determine a tap, among the four taps included in the same group, which outputs a delay closest to external clock period Tc. The second determining operation can be performed in a similar manner to that shown in FIG. 23 by associating in sequence from a more advanced phase each tap in the same group to a sequence of return clocks RCLKa to RCLKd.

A tap outputting a delay closest to external clock period Tc among sixteen taps can be selected in two clock cycles, based on clock period information TPNa to TPNd respectively obtained by such first and second determining operations (hereinafter, such clock period information is also generally denoted by TPN).

Figure 24:
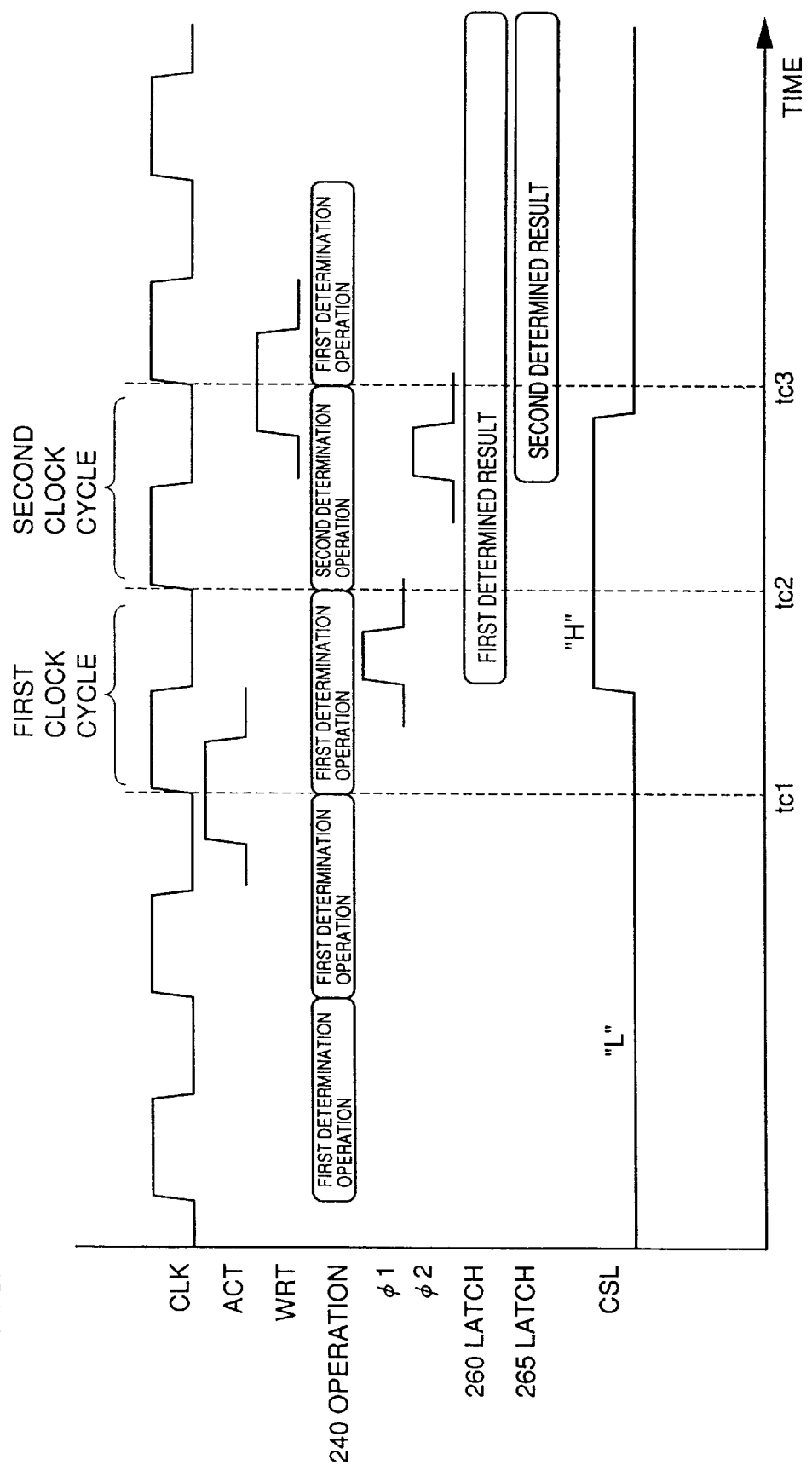
FIG. 24 is a timing chart illustrating an operation of the control clock generating circuit according to the third embodiment of the present invention.

Referring to FIG. 24, in response to activation of external clock CLK at time tc1, activate command ACT is taken in. Before this, selection signal CSL is set to L level, so that return clocks RCLKa to RCLKd are generated by outputs of output taps TP4, TP8, TP12 and TP16 that are fixedly set, and phase comparing circuit 240 performs the first determining operation in each clock cycle.

In the first clock cycle into which activate command ACT is taken, control signal φ1 is activated for a certain period, and thus clock period information TPN based on the first determining operation is transmitted to latch circuit 260 via the multiplexer 255 to be held in latch circuit 260. Further, synchronization detection control circuit 225 switches the signal level of selection signal CSL from L level to H level in order to switch return clocks RCLKa to RCLKd input to phase comparing circuit 240 to the one corresponding to the second determining operation.

The second clock cycle starts in response to activation of external clock CLK at time tc2, and phase comparing circuit 240 performs the second determining operation. In the second clock cycle, control signal φ2 is activated for a certain period, and thus clock period information TPN based on the second determining operation is transmitted to latch circuit 265 via demultiplexer 255 to be held in latch circuit 265.

As a result, before time tc3 when the operation command of write command WRT is input, clock period information TPN corresponding to external clock period Tc can be generated.

Referring again to FIG. 20, clock period information TPN is transmitted to reference clock pulse generating circuit 60 and delay circuit 90.

In reference clock pulse generating circuit 60, an output tap TPk in delay circuit 70 is switched in accordance with clock period information TPN, to appropriately set pulse width Th of reference clock pulse CLKP in accordance with external clock period Tc, as in the case with the first and second embodiments.

In delay circuit 90, activation/inactivation of delay control signals shown in FIGS. 5 and 6 can be set in accordance with clock period information TPN in each delay unit 100, to appropriately set unit delay time tdf for each delay unit 100 in delay circuit 90 in accordance with external clock period Tc, as in the case with the first and second embodiments. It is noted that, though the configurations are shown in FIGS. 5 and 6 in that four delay capacitance circuits controlled by two delay control signals CD1, CD2 and the respective inversion signals thereof are arranged for each delay unit, the number of delay capacitance circuits and delay control signals may here be set in accordance with a bit number of clock period information TPN.

Thus, the control clock generating circuit according to the third embodiment can efficiently detect the external clock period in a predetermined short period of time, and generate a control clock at an appropriate timing corresponding to the external clock period.

Modification of the Third Embodiment

In the modification of the third embodiment, a configuration will be described in that power consumption may be lowered for the control clock generating circuit according to the third embodiment, in a case where a time period from the input of a preliminary command corresponding to activate command ACT for a memory circuit to an input of an operation command corresponding to write command WRT is relatively long.

Figure 25:
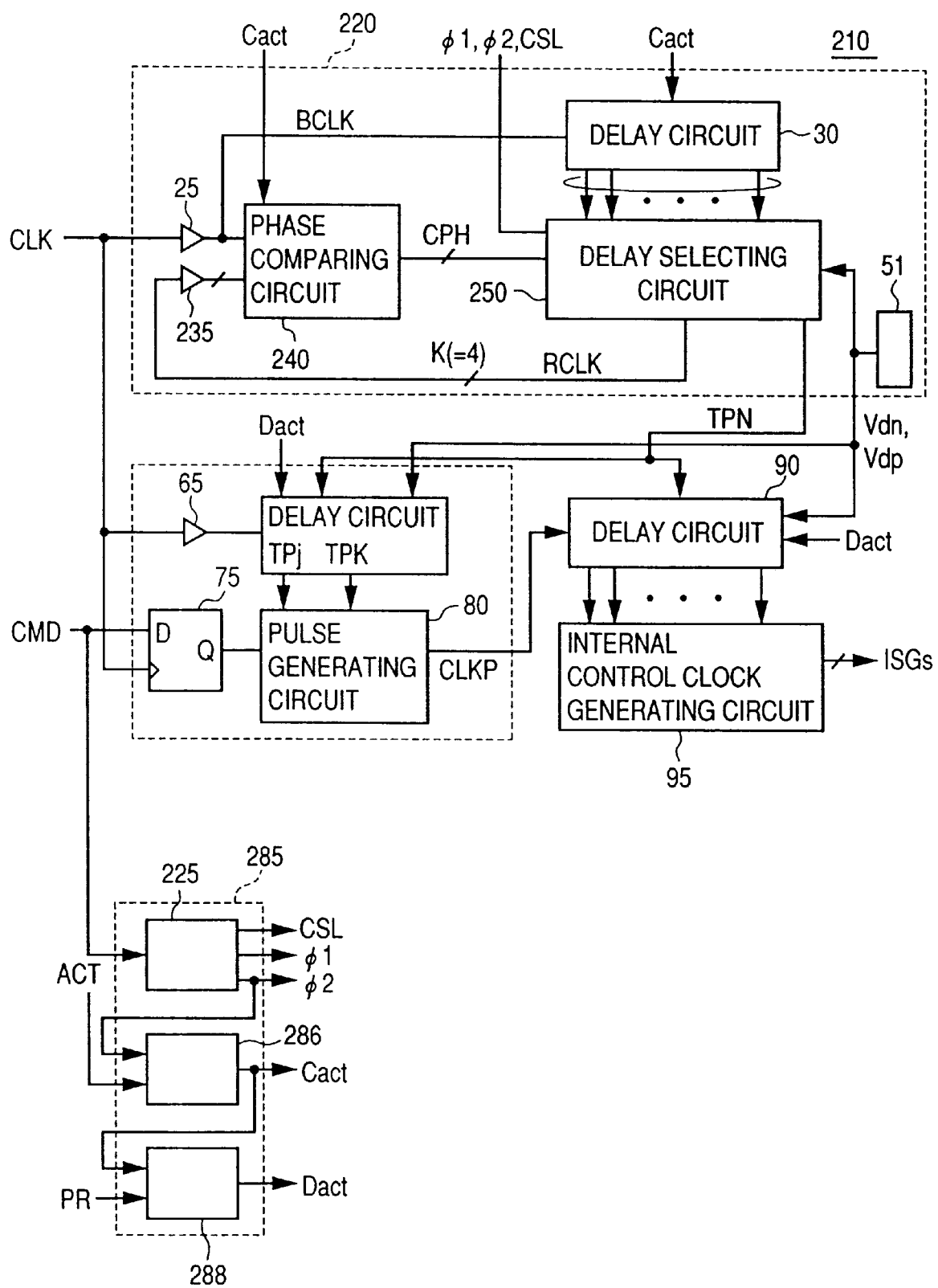
FIG. 25 is a block diagram showing a configuration of a control clock generating circuit according to a modification of the third embodiment of the present invention.

Referring to FIG. 25, a control clock generating circuit 210 according to the alternative example of the third embodiment of the present invention is different from control clock generating circuit 200 according to the third embodiment of the present invention, in that a synchronization detection control circuit 285 is provided in place of synchronization detection control circuit 225.

Synchronization detection control circuit 285 includes, in addition to synchronization detection control circuit 225 generating control signals φ1, φ2 and selection signal CSL, activation control circuits 286 and 288 respectively generating signals Cact and Dact controlling activation of circuit operation in control clock generating circuit 210.

In control clock generating circuit 210, delay circuit 30 and phase comparing circuit 240 performs a predetermined operation in response to control signal Cact, and stops the operation during an inactivation period of control signal Cact. Similarly, delay circuits 70 and 90 perform a predetermined operation in response to control signal Dact, and stops the operation in an inactivation period of control signal Dact. Therefore, inactivation periods of control signals Cact and Dact, the power consumption of control clock generating circuit 210 can be lowered.

Figure 26:
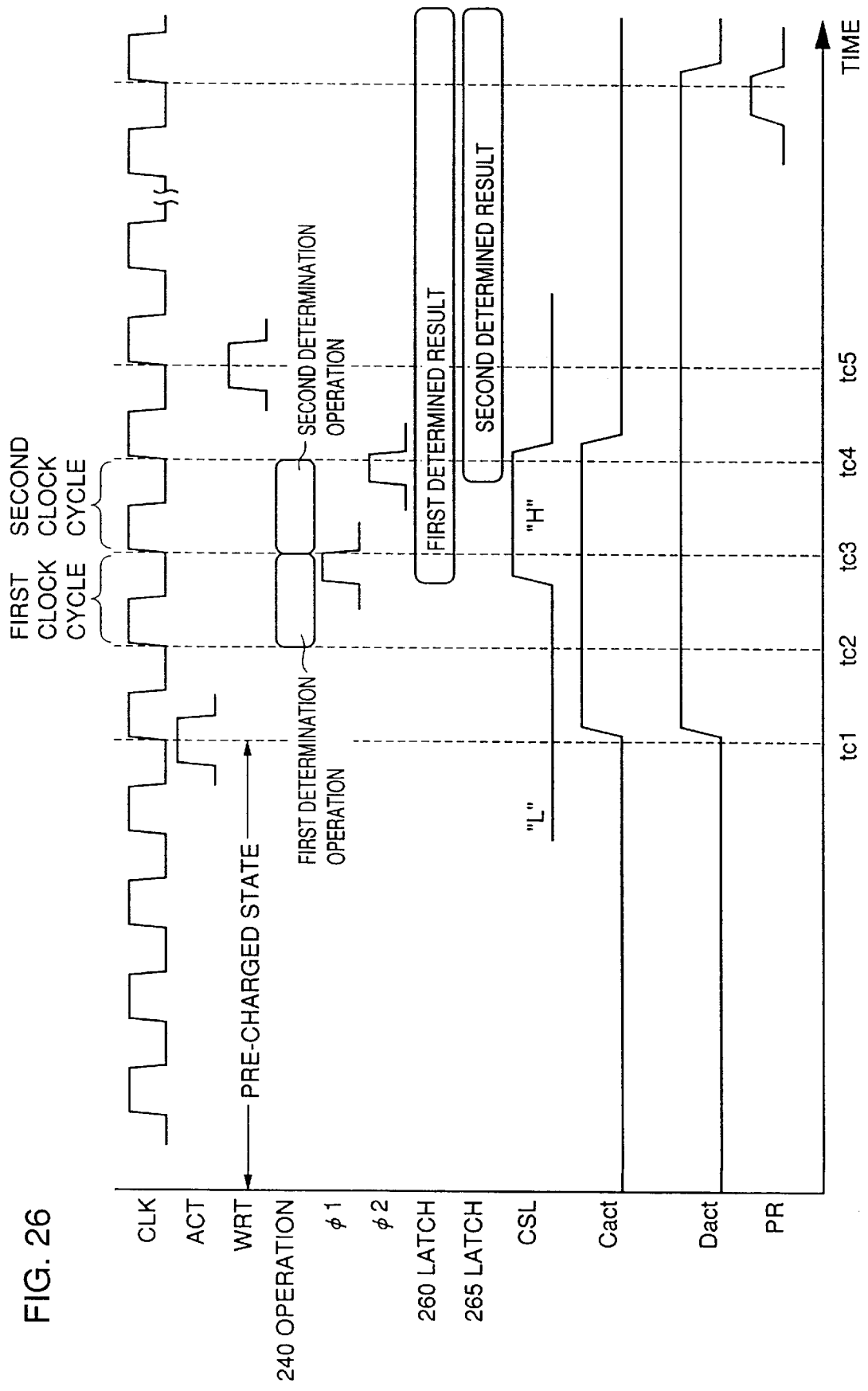
FIG. 26 is a timing chart illustrating an operation of a control clock generating circuit according to a modification of the third embodiment of the present invention.
Figure 27:
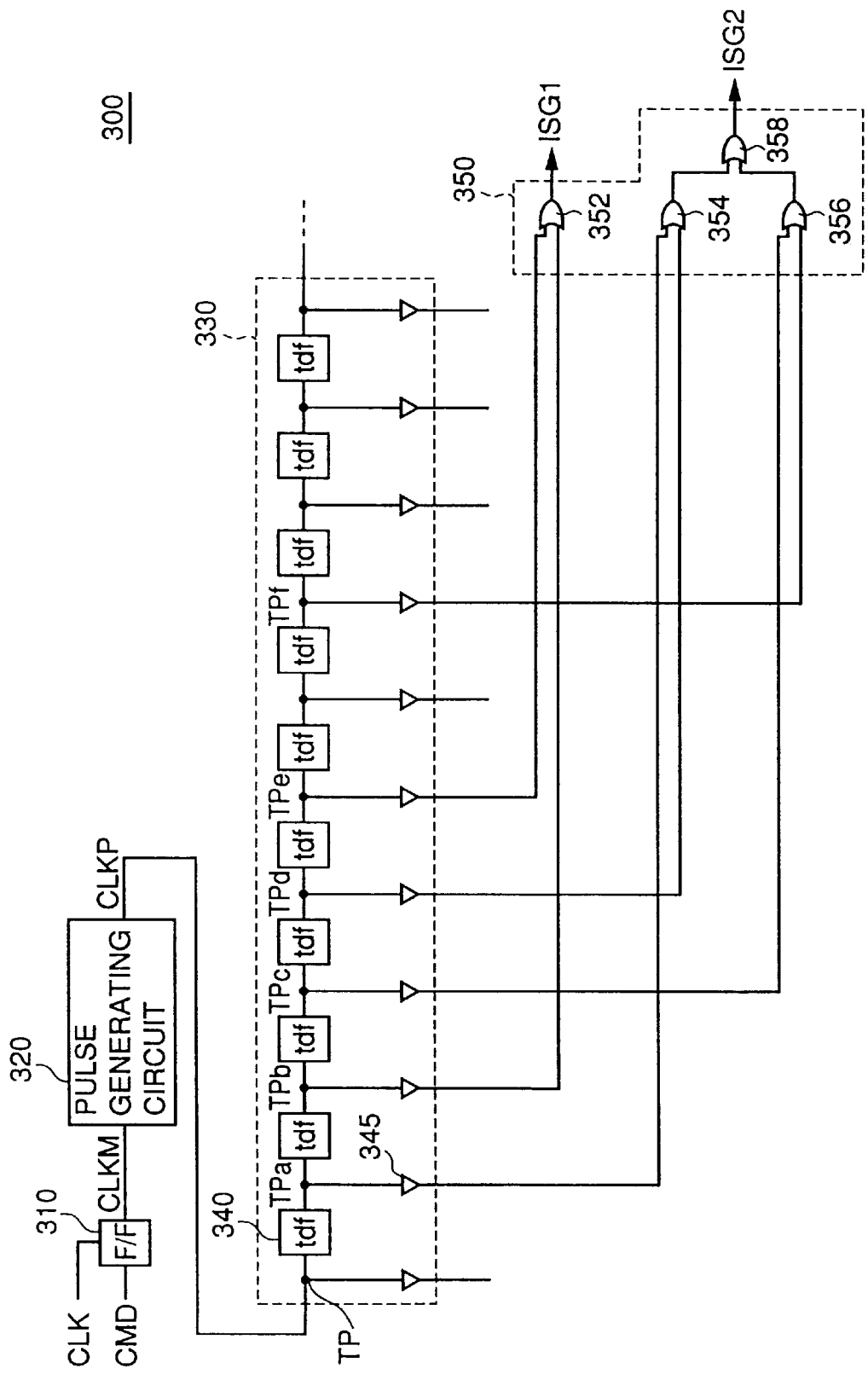
FIG. 27 is a block diagram showing a configuration of a conventional control clock generating circuit 300.
Figure 28:
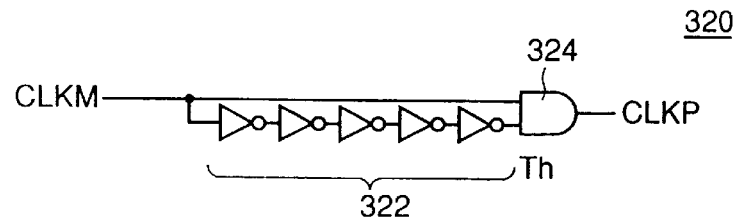
FIG. 28 is a circuit diagram showing a configuration of a pulse generating circuit 320.
Figure 29:
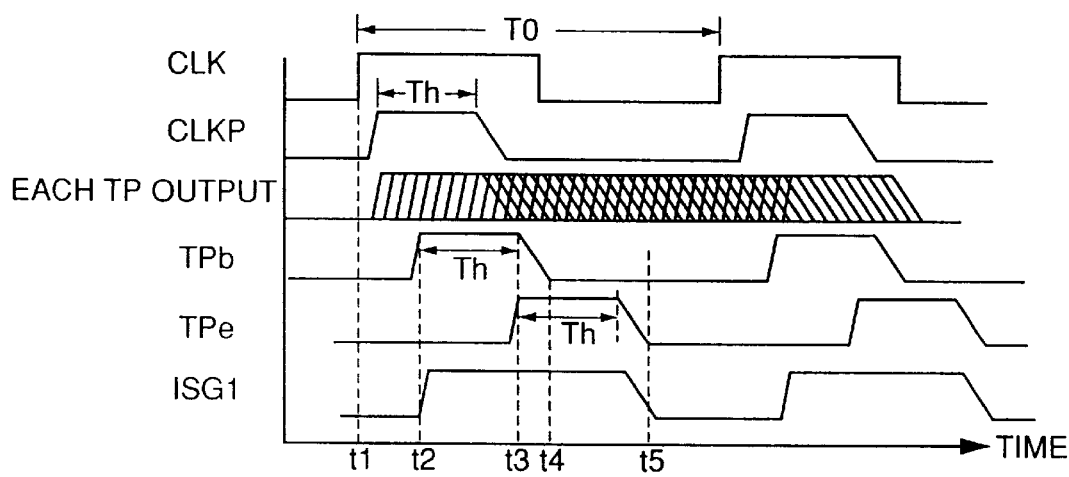
FIG. 29 is the first timing chart illustrating a problem of conventional control clock generating circuit 300 corresponding to variation of a period of an external clock CLK.
Figure 30:
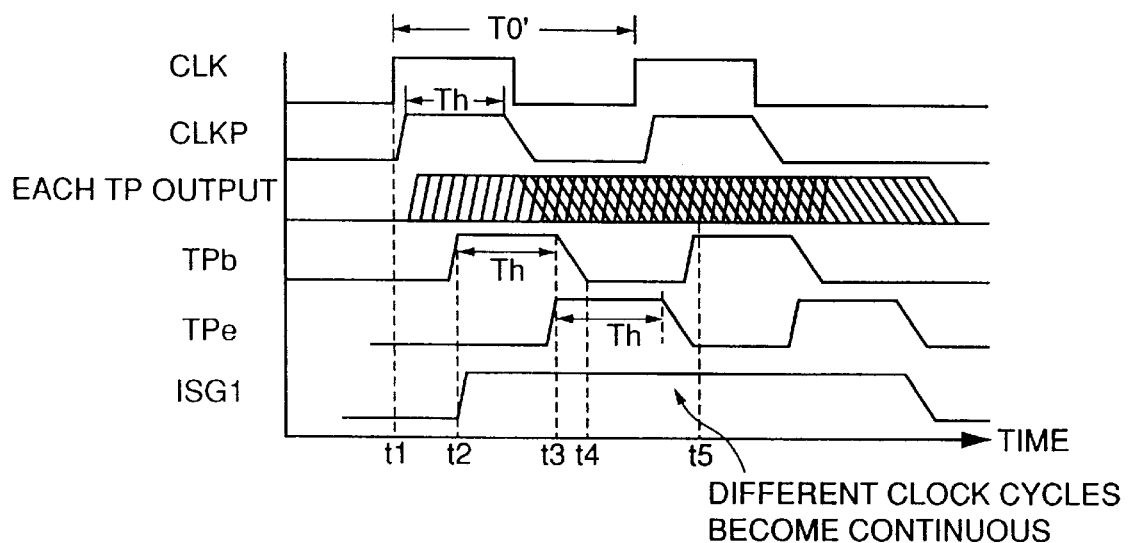
FIG. 30 is the second timing chart illustrating a problem of conventional control clock generating circuit 300 corresponding to a variation of the period of external clock CLK.

FIG. 26 is a timing chart illustrating an operation of the control clock generating circuit according to the alternative embodiment of the third embodiment of the present invention.

Referring to FIG. 26, in response to activation of external clock CLK at time tc1, activate command ACT is taken in. Before this, for example, an internal circuit which is a memory circuit is in a wait state called a precharged state, so that control signals Cact and Dact are inactivated to L level. Therefore, in the pre-charged state, power consumption of delay circuits 30, 70 and 90, and phase comparing circuit 240 can be reduced. Selection signal CSL is set to L level to be prepared for the first determining operation performed in the first clock cycle, in response to an input of activate command ACT.

Control signals Cact and Dact are activated corresponding to the input of activate command ACT at time tc1, and thus generation of the control clock is started.

The first clock cycle starts in response to activation of external clock CLK at time tc2, and the first determining operation is performed in phase comparing circuit 240. Further, control signal φ1 is activated for a certain period, and the clock period information TPN corresponding to the first determining operation is held in latch circuit 260. Synchronization detection control circuit 285 switches the signal level of selection signal CSL from L level to H level in the period of the first clock cycle to feed a return clock corresponding to the second determining operation to phase comparing circuit 240.

The second clock cycle starts in response to activation of external clock CLK at time tc3, and phase comparing circuit 240 performs the second determining operation. Further, control signal φ2 is activated for a certain period, and thus clock period information TPN based on the second determining operation is held in latch circuit 265.

As a result, at time tc4 after the first and second clock cycles have passed, clock period information TPN can be generated in accordance with external clock period Tc. Thus, before time tc5 at which write command WRT which is an operation command is input, generation and holding of clock period information TPN is completed, so that no detecting operation for external clock period Tc will be required in DLL circuit 220. Therefore, control signal Cact can be inactivated to correspond with inactivation of control signal φ2 instructing latch of clock period information TPN. This can reduce the power consumption of control clock generating circuit 210.

Further, after control signal Cact is inactivated, it is possible to inactivate control signal Dact in response to an input of pre-charged command PR instructing the memory circuit which is an internal circuit to be transferred to a pre-charged state corresponding to a waiting state where no generation of the control clock is required, to stop the operations of delay circuits 70 and 90, further reducing power consumption of control clock generating circuit 210.

Therefore, the control clock generating circuit according to the alternative example of the third embodiment enables reduction of power consumption in accordance with a command input to the internal circuit which is, for example, a memory circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device operating in synchronization with an input clock, comprising:
   a control clock generating circuit generating a control clock synchronously with said input clock repeating first and second state transitions between a first sate and a second state in a certain period,
   said control clock generating circuit including
   a period detecting circuit receiving said input clock and detecting said certain period of said input clock,
   a first pulse generating circuit activated in response to said first state transition of said input clock to generate a reference clock pulse for which an activation state is maintained for a predetermined set in a accordance with said certain period,
   a first delay circuit delaying stepwise said reference clock pulse from said first pulse generating circuit to output a plurality of delayed clock pulses, and
   a second pulse generating circuit generating said control clock based on at least two of said plurality of delayed clock pulses; and
   an internal circuit performing a predetermined operation in response to said control clock.

2. The semiconductor device according to claim 1, wherein said predetermined period and said certain period have a constant ratio.

3. The semiconductor device according to claim 1, wherein said first pulse generating circuit generates said reference clock pulse in a clock cycle in which a command is provided to said semiconductor device.

4. The semiconductor device according to claim 1, wherein:
   said period detecting circuit detects said certain period by generating a sub clock synchronized with said input clock; and
   said first pulse generating circuit sets said predetermined period in accordance with delay time of said sub clock to said input clock.

5. The semiconductor device according to claim 4, wherein:
   said period detecting circuit includes
   a phase comparing circuit comparing phases of said input clock and said sub clock, and
   a second delay circuit delaying said input clock to generate said sub dock,
   said second delay circuit including
   M (M is a natural number at least 2) delay units connected in series and each delaying said input clock per unit delay time,
   an Mth delay unit outputting said sub clock; and
   said period detecting circuit further includes
   a driving potential controlling circuit adjusting a driving potential of each of said delay units in accordance with a phase comparison result of said phase comparing circuit,
   said unit delay time varying in accordance with said driving potential.

6. The semiconductor device according to claim 5, wherein
   each of said delay units includes
   an inverter circuit for transmitting a clock which is input, and
   a current-supplying circuit supplying operating current corresponding to said driving potential to said inverter circuit.

7. The semiconductor device according to claim 5, wherein
   said first pulse generating circuit includes
   a third delay circuit receiving said input clock to generate said reference clock pulse,
   said third delay circuit including at least N (N is a natural number less than M) delay circuit units connected in series and each having said unit delay time,
   an Nth delay unit in said third delay circuit outputting said reference clock pulse,
   each of said delay units in said second and third delay circuits including
   an inverter circuit for transmitting a clock which is input, and
   a current-supplying circuit supplying operating current corresponding to said driving potential to said inverter circuit.

8. The semiconductor device according to claim 1, wherein
   said first delay circuit includes
   a plurality of delay units connected in series and each delaying said reference clock pulse per unit delay time, and
   a plurality of output taps provided to respectively take out outputs of said plurality of delay units as said plurality of delayed clock pulses,
   said unit delay time being set in accordance with said certain period.

9. The semiconductor device according to claim 8, wherein said unit delay time and said certain period have a constant ratio.

10. The semiconductor device according to claim 8, wherein
    said period detecting circuit detects said certain period by generating a sub clock synchronized with said input clock; and
    said unit delay time is set in accordance with delay time of said sub clock to said input clock.

11. The semiconductor device according to claim 10, wherein
    said period detecting circuit includes
    a phase comparing circuit comparing phases of said input clock and said sub clock,
    a second delay circuit delaying said input clock to generate said sub clock, and
    a driving potential controlling circuit adjusting a driving potential of each of said delay units in accordance with a phase comparison result of said phase comparing circuit,
    said second delay circuit including M (M is a natural number at least 2) delay units connected in series and each delaying said input clock per said unit delay time,
    an Mth delay unit outputting said sub clock,
    said unit delay time of each of delay units in said first and second delay circuits varying in accordance with said driving potential.

12. The semiconductor device according to claim 11, wherein
  each of said delay units in said first and second circuits includes
    an inverter circuit transmitting a clock which is input, and
    a current-supplying circuit supplying operating current corresponding to said driving potential to said inverter circuit.

13. The semiconductor device according to claim 8, wherein
  said second pulse generating circuit includes a logic circuit generating said control clock pulse based on activation of two of said plurality of delayed clock pulses.

14. The semiconductor device according to claim 8, wherein
  said second pulse generating circuit includes
    a first logic circuit generating a first pulse signal based on activation of two of said plurality of delayed clock pulses,
    a second logic circuit generating a second pulse signal for which an activation state is partly overlapped with that of said first pulse signal, based on activation of other two of said plurality of delayed clock pulses, and
    a third logic circuit generating said control clock pulse based on a result of an OR operation of said first and second pulse signals.

15. The semiconductor device according to claim 1, wherein
  said input clock is input as a complementary clock;
  said period detecting circuit detects said certain period by generating a sub clock synchronized with said input clock;
  said period detecting circuit includes
    a first clock buffer receiving said input clock for making an amplitude of said input clock smaller,
    a second delay circuit having M (M is a natural number equal to or greater than 2) delay units connected in series and each delaying said input clock per unit delay time, and delaying an input clock which has passed through said first clock buffer to generate said sub clock,
    a phase comparing circuit comparing phases of said input clock and said sub clock, and
    a driving potential controlling circuit adjusting a driving potential of each of said delay units in accordance with a phase comparison result of said phase comparing circuit;
  said first pulse generating circuit further includes a second clock buffer receiving said input clock for making an amplitude of said input clock smaller;
  said first pulse generating circuit generates said reference clock pulse as a complementary clock based on said input clock which has passed through said second clock buffer and delay time between said input clock and said sub clock; and
  said first delay circuit includes
    a plurality of delay units connected in series and each delaying said reference clock pulse per said unit delay time, and
    a plurality of output taps provided to respectively take out outputs of said plurality of delay units as said plurality of delayed clock pulses,
    said unit delay time of each delay unit in said first and second delay circuits varying in accordance with said driving potential.

16. The semiconductor device according to claim 15, wherein
  said first delay circuit further includes a plurality of amplifying circuits provided respectively corresponding to said plurality of output taps, each for amplifying and outputting each of complementary clocks constituting a corresponding one of said plurality of delayed clock pulses.

17. The semiconductor device according to claim 15, wherein
  said first delay circuit further includes a plurality of amplifying circuits provided corresponding to said plurality of output taps, and each for amplifying and outputting each of complementary clocks constituting a corresponding one of said plurality of delayed clock pulses; and
  said second pulse generating circuit includes a plurality of differential amplifying circuits converting at least said two of complementary clocks of said plurality of delayed clock pulses into single clocks.

18. A semiconductor device operating in synchronization with an input clock repeating first and second state transitions between a first state and a second state in a certain period, comprising:
  an internal circuit performing a predetermined operation in response to a first command and a second command provided after predetermined clock cycles of said input clock from said first command; and
  a control clock generating circuit taking in said first and second commands in response to said first state transition of said input clock to generate a control clock for rendering said internal circuit perform said predetermined operation;
  said control clock generating circuit including
    a period detecting circuit detecting said certain period during L dock cycles (L is a natural number), that are equal to or shorter than said predetermined clock cycles, after said first command is taken in,
    a first pulse generating circuit activated in response to said first state transition of said input clock to generate a reference clock pulse for which an activation state is maintained for a predetermined period set in accordance with said certain period detected by said period detecting circuit,
    a first delay circuit having a plurality of first delay units connected in series and each having unit delay time set in accordance with said certain period, and delaying stepwise said reference clock pulse from said first pulse generating circuit to output a plurality of delayed clock pulses, and
    a second pulse generating circuit generating said control clock based on at least two of said plurality of delayed clock pulses.

19. The semiconductor device according to claim 18, wherein
  L is 2;
  said period detecting circuit includes a second delay circuit delaying said input clock,
  said second delay circuit including
    $K^2$ second delay units connected in series for delaying said input clock and each having unit delay time,
    said $K^2$ second delay units being divided into K groups each having K delay units;
  said period detecting circuit further includes
    a delay selecting circuit for selecting K of said $K^2$ second delay units, and a phase comparing circuit comparing phases of each output of K second delay units selected by said delay selecting circuit and said input clock, said delay selecting circuit selecting a predetermined one of second delay units from said each group in a first clock cycle of said L clock cycles, and selecting K second delay units constituting one group of said K groups selected in accordance with a phase comparison result of said phase comparing circuit in said first clock cycle in a second clock cycle of said L clock cycles;

said period detecting circuit further includes a latch circuit holding said phase comparison result in said first and second dock cycles; and each of said first delay units includes a delay control circuit adjusting said unit delay time in accordance with said phase comparison result held in said latch circuit.

20. The semiconductor device according to claim 19, wherein said L clock cycles are shorter than said predetermined dock cycles; and said period detecting circuit stops operations of said phase comparing circuit and said second delay circuit, before said first command is input and after said phase comparison result in said L clock cycles is held in a latch circuit.

* * * * *